US006861686B2

(12) United States Patent
Lee et al.

(10) Patent No.: US 6,861,686 B2
(45) Date of Patent: Mar. 1, 2005

(54) STRUCTURE OF A CMOS IMAGE SENSOR AND METHOD FOR FABRICATING THE SAME

(75) Inventors: Soo-Geun Lee, Kyung-Gi Do (KR); Ki-Chul Park, Kyung-Gi Do (KR); Kyoung-Woo Lee, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/633,709

(22) Filed: Aug. 5, 2003

(65) Prior Publication Data

US 2004/0140564 A1 Jul. 22, 2004

(30) Foreign Application Priority Data

Jan. 16, 2003 (KR) .............................. 10-2003-0002932
Mar. 25, 2003 (KR) .............................. 10-2003-0018651
May 29, 2003 (KR) .............................. 10-2003-0034305

(51) Int. Cl.$^7$ ...................... H01L 31/062; H01L 31/113
(52) U.S. Cl. .................... 257/291; 257/292; 438/57; 438/60
(58) Field of Search ............................... 257/291, 292; 438/57, 60

(56) References Cited

U.S. PATENT DOCUMENTS

2002/0037643 A1 * 3/2002 Ishimaru ..................... 438/642
2002/0048840 A1    4/2002 Tanigawa
2003/0100181 A1 * 5/2003 Park et al. ................... 438/639

FOREIGN PATENT DOCUMENTS

JP     2002-64193      2/2002
KR     P2001-59316 A   7/2001

* cited by examiner

*Primary Examiner*—Long Pham
(74) *Attorney, Agent, or Firm*—Lee & Sterba, P.C.

(57) ABSTRACT

An image sensor device and method for forming the same include a photodiode formed in a substrate, at least one electrical interconnection line electrically associated with the photodiode, a light passageway having a light inlet, the light passageway being positioned in alignment with the photodiode, a color filter positioned over the light inlet of the light passageway and a lens positioned over the color filter in alignment with the light passageway wherein the at least one electrical interconnection line includes a copper interconnection formation having a plurality of interlayer dielectric layers in a stacked configuration with a diffusion barrier layer between adjacent interlayer dielectric layers, and a barrier metal layer between the copper interconnection formation and the plurality of interlayer dielectric layers and intervening diffusion barrier layers. An image sensor device may employ copper interconnections if a barrier metal layer is removed from above a photodiode.

14 Claims, 36 Drawing Sheets

STRUCTURE OF A CMOS IMAGE SENSOR AND METHOD FOR FABRICATING THE SAME

BACKGROUND OF THE INVENTION

1. Field of the Invention

The present invention relates to a structure of a photodiode image sensor device and a method for fabricating the same. More particularly, the present invention relates to a photodiode image sensor device having a copper interconnection and a method for fabricating the same.

2. Description of the Related Art

A photodiode image sensor converts optical information into electrical signals. There are basically two different types of solid state image sensor devices: a MOS (metal-oxide-semiconductor) type and a CCD (charge coupled device) type. Products employing photodiodes include those that employ contact image sensors (CISs) such as hand held phones (HHPs), cameras including those integrated into cellular phones, and scanners. Other products employing photodiodes include those that rely on charge coupled devices (CCDs), such as CCTV cameras, camcorders and digital cameras.

For years, aluminum has traditionally been used in the IC industry as a metal for making electrical interconnections in IC devices; however, it is generally difficult to form aluminum interconnections for a semiconductor device having a design rule or pattern thickness below 0.13 $\mu$m. But, as semiconductor devices become more highly integrated, smaller interconnection contacts are becoming increasingly necessary. Accordingly, as the demand for smaller photodiode image sensor devices increases, the pressure to make photodiode image sensors having electrical interconnections with a design rule or pattern thickness of less than 0.13 $\mu$m increases.

Copper has been suggested as an alternative to aluminum in applications where the design rule or pattern thickness is below 0.13 $\mu$m. However, copper atoms tend to diffuse into surrounding materials, such as into an interlayer dielectric layer, and can negatively impact the electrical characteristics of underlying transistors or other elements. Therefore, in order to use copper as an interconnection material in an integrated circuit device, a diffusion barrier layer is necessary to prevent diffusion of the copper into surrounding materials. Typically, such a diffusion barrier layer is formed of SiN or SiC. However, these materials are opaque, and therefore negatively impact the performance of image devices having a photodiode, which depends completely on the level of external light that it receives.

SUMMARY OF THE INVENTION

In an effort to overcome the drawbacks and problems described above, it is a feature of an embodiment of the present invention to provide an image sensor device including a substrate having a photodiode formed therein, an isolation region formed in the substrate to a first side of the photodiode, and a plurality of transistors formed on the substrate to a second side of the photodiode, the photodiode being electrically associated with the transistors, at least one lower contact formed on source/drain regions and gates of the transistors, at least one electrical interconnection line formed on the at least one lower contact and being electrically associated with the photodiode, a light passageway having a light inlet, the light passageway being positioned in alignment with the photodiode, a color filter positioned over the light inlet of the light passageway; and a lens positioned over the color filter in alignment with the light passageway, wherein the at least one electrical interconnection line includes a copper interconnection formation running through a plurality of interlayer dielectric layers in a stacked configuration with a diffusion barrier layer between adjacent interlayer dielectric layers, and a barrier metal layer between the copper interconnection formation and the plurality of interlayer dielectric layers and intervening diffusion barrier layers.

The photodiode may be a p/n photodiode, a PIN photodiode, or an avalanche photodiode. The image sensor device may be a charge coupled device or a contact image sensor.

The image sensor device may further include a first protection layer covering the uppermost surface of the copper interconnection, which may be formed of one selected from the group consisting of SiC, SiN, $SiO_2$ on SiN, and $SiO_2$ on SiC. The image sensor device may further include a second protection layer disposed on the first protection layer and an inner surface of the light passageway, which may be formed of a silicon oxide series material. The second protection layer may have an antireflective property at a bottom of the light passageway.

The lower contact may be formed of one selected from the group consisting of copper, tungsten and titanium. When the lower contact is formed of copper, a barrier metal layer to prevent copper diffusion may be interposed between the lower contact and the first of the plurality of interlayer dielectric layers. The image sensor may further include an antireflective layer formed on the substrate having the photodiode, the plurality of transistors and the isolation region, or the image sensor device may include an antireflective layer patterned on the photodiode under the light passageway. In the image sensor device, the light passageway may be filled with a transparent material such as a spin-on-glass (SOG) or a photoresist. The color filter may include a photoresist containing dies. The lens may be a convexly shaped micro lens. The image sensor device may further include a barrier metal layer on sidewalls of the light passageway.

It is another feature of an embodiment of the present invention to provide a method for forming an image sensor device including forming a photodiode in a substrate, forming an isolation region in the substrate to a first side of the photodiode, forming a plurality of transistors on the substrate to a second side of the photodiode, the transistors having source/drain regions and a gate, forming on the substrate having the photodiode an interlayer dielectric structure having a plurality of alternately stacked interlayer dielectric layers and diffusion barrier layers with an uppermost layer being an interlayer dielectric layer, and concurrently forming at least one electrical connection line formed of a copper interconnection within a barrier metal layer through the alternately stacked interlayer dielectric layers and diffusion barrier layers to be electrically associated with the photodiode and the at least one transistor, forming a light passageway having a light inlet in alignment with the photodiode by removing portions of the interlayer dielectric structure over the photodiode, forming a color filter over the light inlet of the light passageway; and forming a lens over the color filter to be in alignment with the light passageway.

In the method for forming the image sensor device, the photodiode may be formed to be one selected from the group consisting of a p/n photodiode, a PIN photodiode and an avalanche photodiode.

In one embodiment of the present invention, forming the interlayer dielectric structure and the light passageway further includes, A. forming a first interlayer dielectric layer of a transparent material on the substrate having the photodiode, the isolation region and the plurality of transistors, B. patterning the first interlayer dielectric layer to form contact holes over source/drain regions and gates of the transistors, C. filling the contact holes with metal to form lower contacts D. sequentially forming a first diffusion barrier layer and a second interlayer dielectric layer on the first interlayer dielectric layer, E. patterning the second interlayer dielectric layer and the first diffusion barrier layer to form via holes over the lower contacts, F. patterning the second interlayer dielectric layer to form trenches over the via holes, G. forming a barrier metal layer in the via holes and trenches, H. filling the via holes and the trenches with copper to form a copper interconnection, I. repeating D–H to form the interlayer dielectric layer structure having a predetermined number of layers, J. forming a first protective layer on the copper interconnection in the uppermost interlayer dielectric layer before forming the light passageway, K. filling the light passageway with a transparent material before forming the color filter and the lens.

In another embodiment of the present invention, forming the light passageway includes sequentially etching a portion of each interlayer dielectric layer and diffusion barrier layer at a position over the photodiode down to the first interlayer dielectric layer.

In another embodiment of the present invention, the method further includes patterning the second interlayer dielectric layer and the first diffusion barrier layer to also form a dummy hole over the photodiode in E, forming the barrier metal layer in the dummy hole in G, and filling the dummy hole with copper to form a copper dummy pattern in addition to the copper interconnection in H. Forming the light passageway preferably includes performing a wet etching process to remove the copper dummy patterns positioned over the photodiode and removing the barrier metal layer remaining on a bottom and sidewalls of the light passageway.

In another embodiment of the present invention, the method further includes patterning the second interlayer dielectric layer and the first diffusion barrier layer to also form two dummy holes over opposite ends of the photodiode in E, thereby forming an interlayer dielectric dummy pattern over the photodiode in between the two dummy holes, forming the barrier metal layer in the dummy holes in G, and filling the dummy holes with copper in H. The widths of the two dummy holes and the via holes are preferably the same. Also, the interlayer dielectric dummy pattern may be etched while the trenches are etched in F, such that the interlayer dielectric dummy pattern has a height equal to a depth of the trenches. Forming the light passageway preferably includes performing a wet etching process on the copper in the dummy holes, thereby removing the copper in the dummy holes and the interlayer dielectric dummy patterns.

Forming the interconnections in H preferably includes forming a copper layer on the interlayer dielectric layer to fill the via holes and trenches, and planarizing the copper layer by chemical mechanical polishing to expose a surface of the underlying interlayer dielectric layer.

In another embodiment of the present invention, in C, if the metal is copper, the method further includes forming a barrier metal layer in the contact holes before filling the contact holes with the metal.

BRIEF DESCRIPTION OF THE DRAWINGS

The above features and advantages of the present invention will become more apparent to those of ordinary skill in the art by describing in detail preferred embodiments thereof with reference to the attached drawings in which.

DETAILED DESCRIPTION OF THE INVENTION

Figure 1:
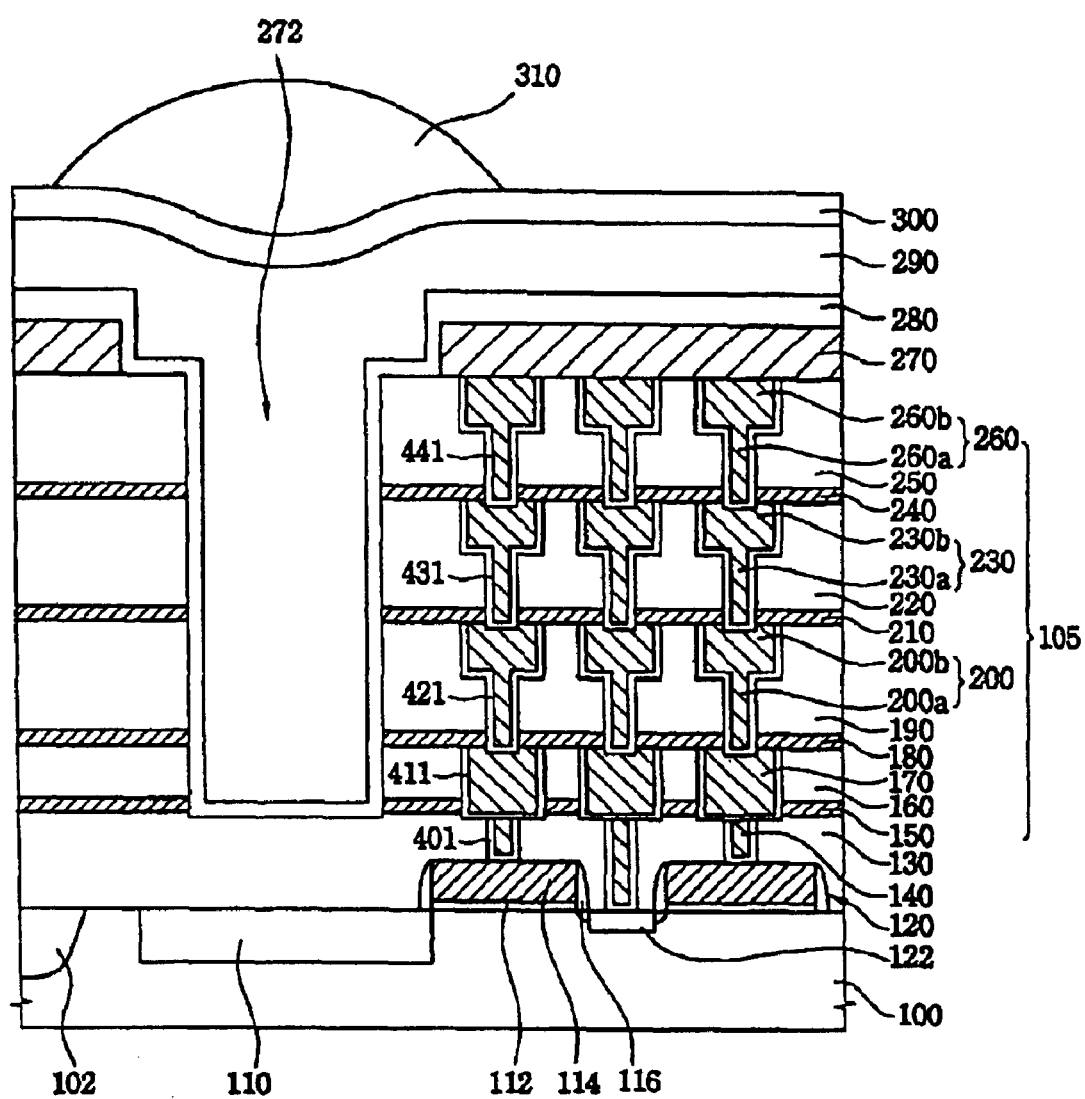
FIG. 1 illustrates a cross-sectional view of a photodiode image sensor device according to a first embodiment of the present invention.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Furthermore, it will also be understood that while particular embodiments of the present invention are described in connection with a p/n photodiode, other photodiodes such as a PIN photodiode and an avalanche photodiode may be used.

In an embodiment of the present invention, an image sensor device is provided as illustrated in FIG. 1. The image sensor device includes a substrate 100 having a p/n photodiode 110, which is a light-receiving element, formed therein, an isolation region 102 formed in the substrate 100 to a first side of the p/n photodiode 110, and a plurality of transistors 120 formed on the substrate 100 to a second side of the p/n photodiode 110. Each of the plurality of transistors 120 includes a gate insulating layer 112, a gate electrode 114, a source/drain region 122 and spacers 116. An electrical interconnection line 105 contacts source/drain region 122 and gate electrode 114 of transistors 120 by contacts 140. A transistor 120 is connected with the p/n photodiode 110, and receives electrons generated by the p/n photodiode 110 when light incident on the p/n diode has sufficient energy to generate electron-hole pairs. Light is transmitted to the p/n photodiode 110 through a light passageway 272 positioned in alignment with the p/n photodiode 110. The energetic, light-induced charges move to create a current that flows through the electrical interconnection line 105, which is in electrical connection with the p/n photodiode 110 via the transistors 120. The p/n photodiode 110 of the image sensor device converts light energy to electric energy by the process just described.

The image sensor device further includes a color filter 300 formed over the light passageway 272 and a lens 310 formed on the color filter. The electrical interconnection line comprises copper interconnections 170, 200, 230, and 260 formed respectively in barrier metal layers 411, 421, 431 and 441, to prevent diffusion of copper atoms into interlayer dielectric layers 130, 160, 190, 220, and 250, where they can travel to the transistors 120 and cause adverse electrical effects. Copper interconnections 200, 230, and 260 are respectively formed of trenches 200b, 230b, and 260b, and vias 200a, 230a, and 260b. Diffusion barrier layers 150, 180, 210, and 240 are formed between adjacent interlayer dielectric layers. The image sensor device further includes a first protection layer 270 formed on the uppermost copper interconnection 260 in the uppermost interlayer dielectric layer 250, where it serves to protect the electrical interconnection line 105 when the light passageway 272 is formed over the p/n photodiode 110. Various methods by which the light passageway 272 may be formed will be described below with respect to different embodiments of the present invention. Finally, FIG. 1 illustrates a second protection layer 280, which may be formed on the first protection layer 270 and on an inner surface of the light passageway 272.

It should be noted that the present invention provides methods by which copper interconnections may be used in an image sensor device, thereby allowing fabrication of an image sensor device having a design rule or pattern thickness of less than 0.13 µm.

Figure 8:
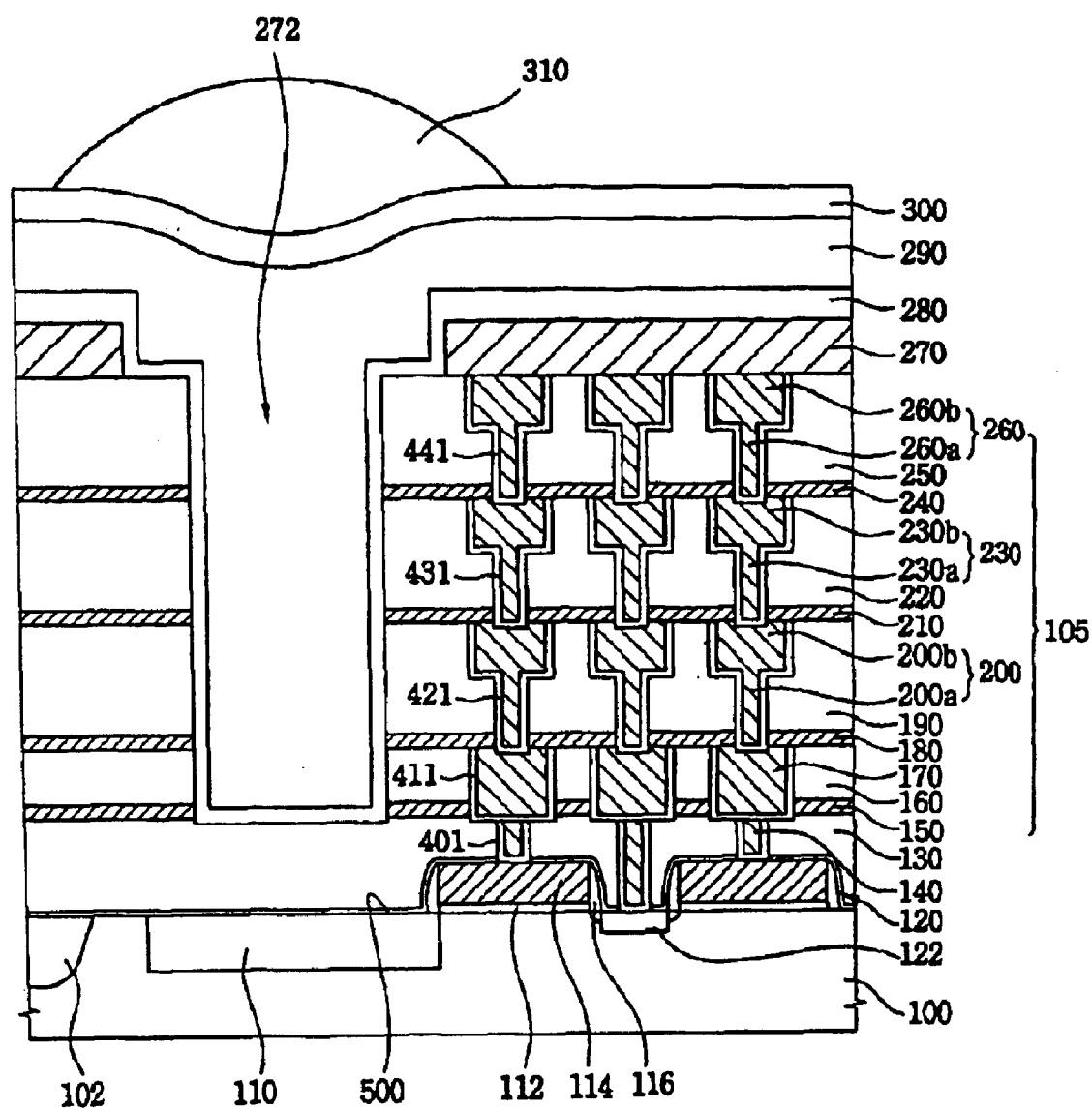
FIGS. 8 and 9 illustrate cross-sectional views of a photodiode image sensor device having an antireflection layer according to the present invention.
Figure 9:
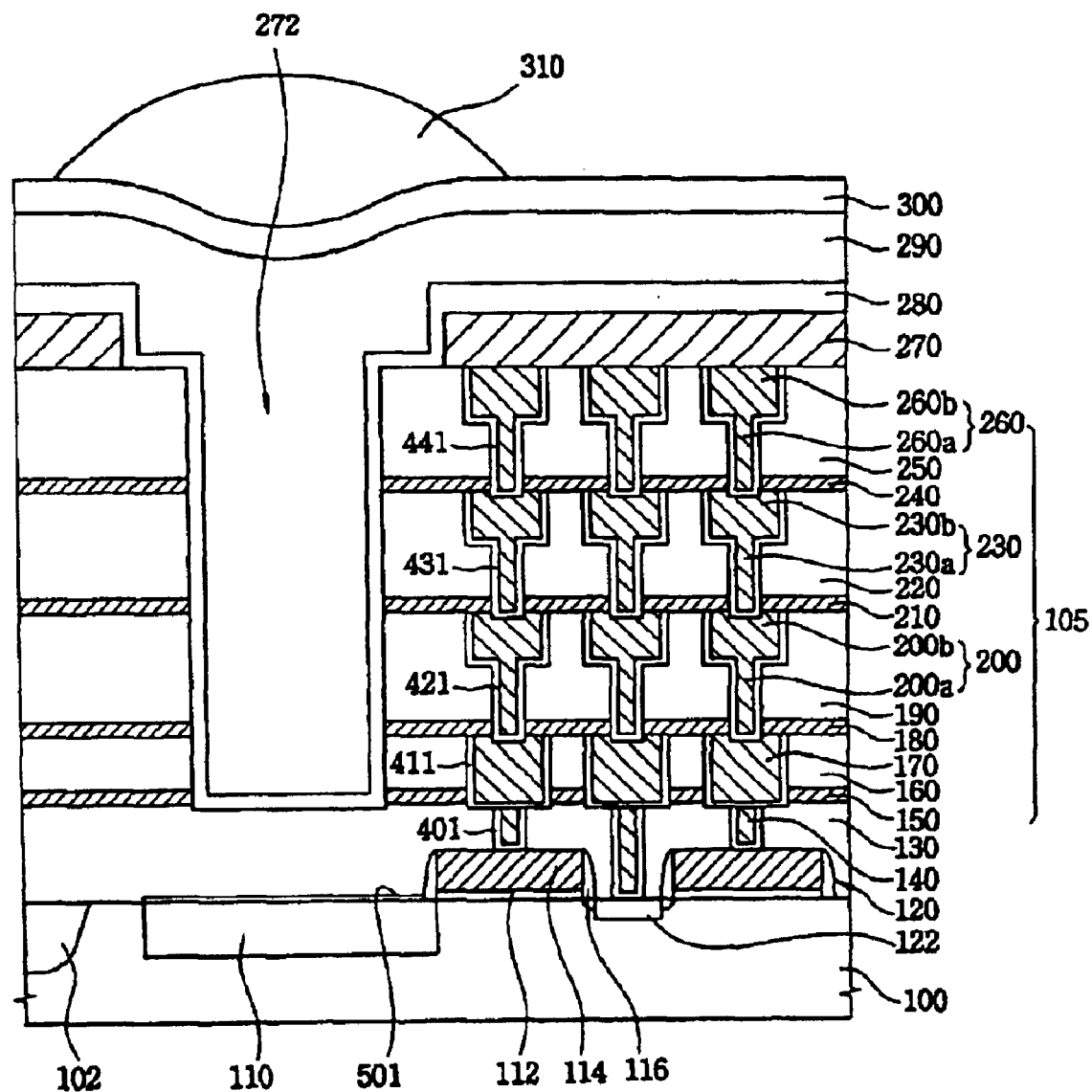

The image sensor device may further include an antireflection layer 500 formed on the substrate, as illustrated in FIG. 8. Alternatively, the image sensor device may include an antireflection layer pattern 501 under the light passageway 272, as illustrated in FIG. 9. A portion of the second protection layer at a bottom of the light passageway 272 may be formed of an antireflective material, in which case an additional antireflection layer such as 500 or 501 is not necessary.

Embodiments of the present invention describing different methods of forming the device illustrated in FIGS. 1, 3, 8 and 9 will now be described in detail.

Figure 2A:
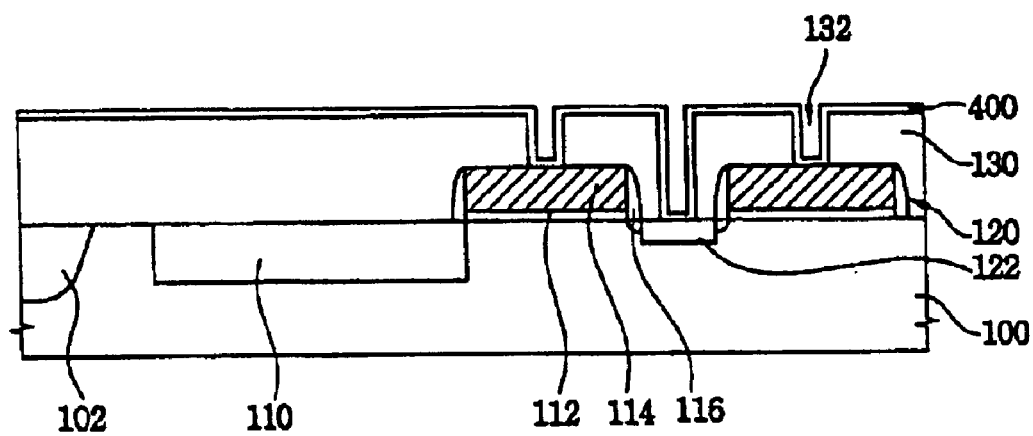
FIGS. 2A–2R illustrate cross-sectional views of the photodiode image sensor device illustrated in FIG. 1 at various stages of formation for showing a method for forming an image sensor device according to a first embodiment of the present invention.

With reference to FIG. 2A, a p/n photodiode 110, which is a light receiving element, is formed in a semiconductor substrate 100, an isolation region 102 is formed to a first side of the p/n photodiode 110, and a plurality of transistors 120 are formed to a second side of the p/n photodiode 110. Each transistor 120 includes a gate insulating layer 112, a gate electrode 114, a source/drain region 122 and spacers 116. A first interlayer dielectric layer 130 is formed of a transparent material such as a silicon oxide. The first interlayer dielectric layer 130 is patterned using known techniques, such as depositing and developing a photoresist material to make a mask pattern, through which dielectric material may be removed. A pattern of the dielectric material is removed by an etch process such as plasma etching or reactive ion etching, to form contact holes 132, which expose portions of the source/drain regions 122 and the gate electrodes 114. A first barrier metal layer 400 may be formed on the first interlayer dielectric layer 130 and in the contact holes 132.

Figure 2B:
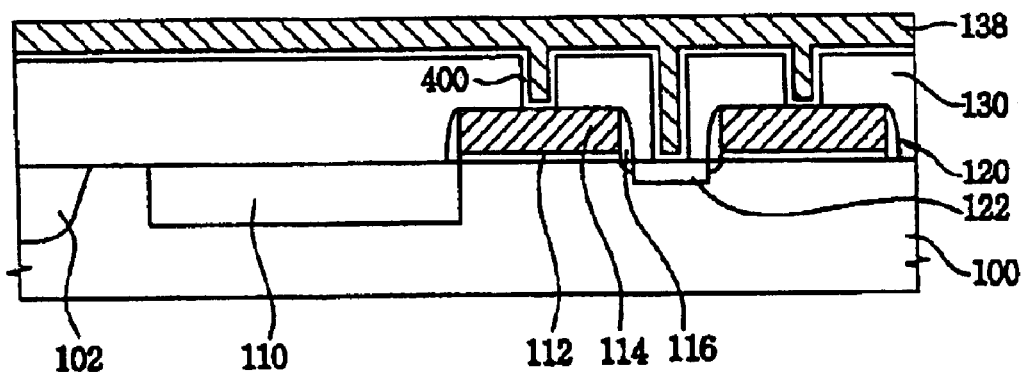

As illustrated in FIG. 2B, the contact holes 132 are then filled with a metal 138 such as titanium, tungsten or copper. The metal 138 may be deposited by electroplating, electroless plating, chemical vapor deposition, physical vapor deposition or any combination thereof. When using copper, it is preferable to use a barrier metal layer 400 in the contact holes for preventing copper diffusion. When a barrier metal layer is to be used in the contact holes 132, the first barrier metal layer 400 may be formed using a standard sputtering method.

Figure 2C:
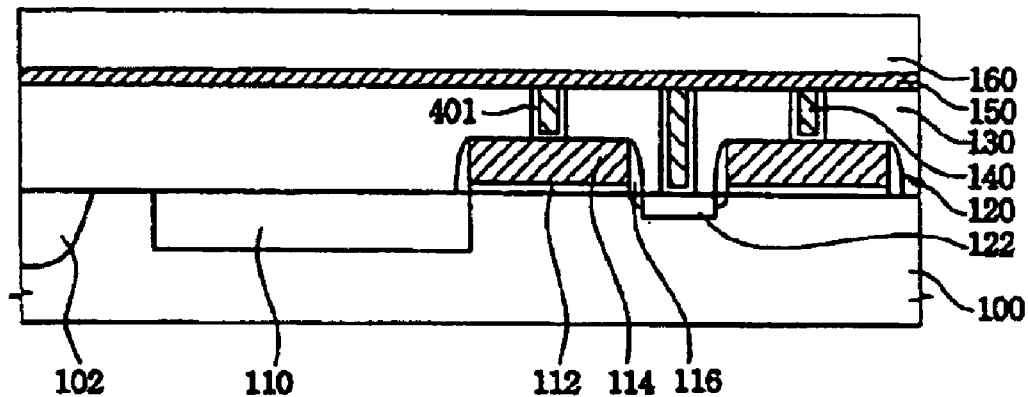

Referring to FIG. 2C, excess metal 138 (of FIG. 2B) and first barrier metal layer 400 (of FIG. 2B) may be removed by a method such as chemical mechanical polishing to expose the surface of the first interlayer dielectric layer 130, thereby forming lower contacts 140 on portions of the first barrier metal layer 401 in the contact holes 132 (of FIG. 2A). A first diffusion barrier layer 150 and a second interlayer dielectric layer 160 are sequentially formed on the first interlayer dielectric layer 130. The diffusion barrier layer 150 acts to prevent copper from diffusing into the interlayer dielectric layer 130, thereby protecting the underlying transistors 120 which are sensitive to copper diffusion. The diffusion barrier layer 150 further acts as an etch stop layer. The diffusion barrier layer 150 may be formed of SiN or SiC, but SiC may further include N or O and SiN may further include O. The thickness of the diffusion barrier layer 150 may be 200~1000 Å, and is preferably 300~700 Å. Because SiN and SiC are opaque, portions of the barrier layer must be removed to prevent filtering of light before the light reaches the p/n photodiode 110.

Figure 2D:
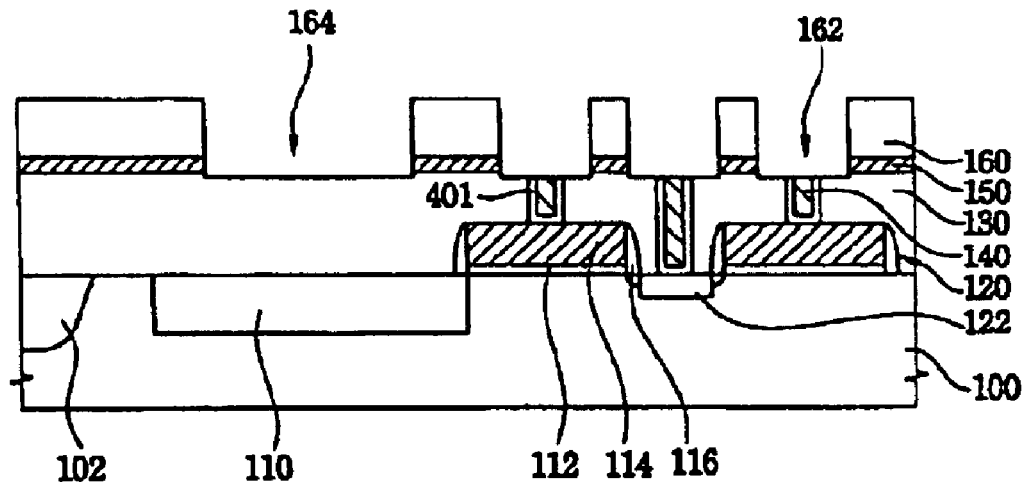
Figure 2E:
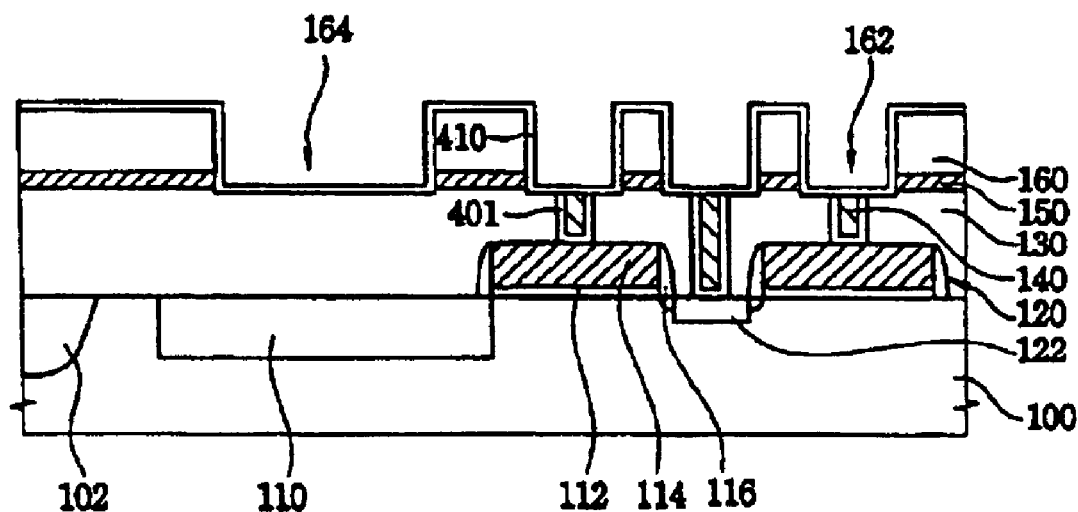
Figure 2F:
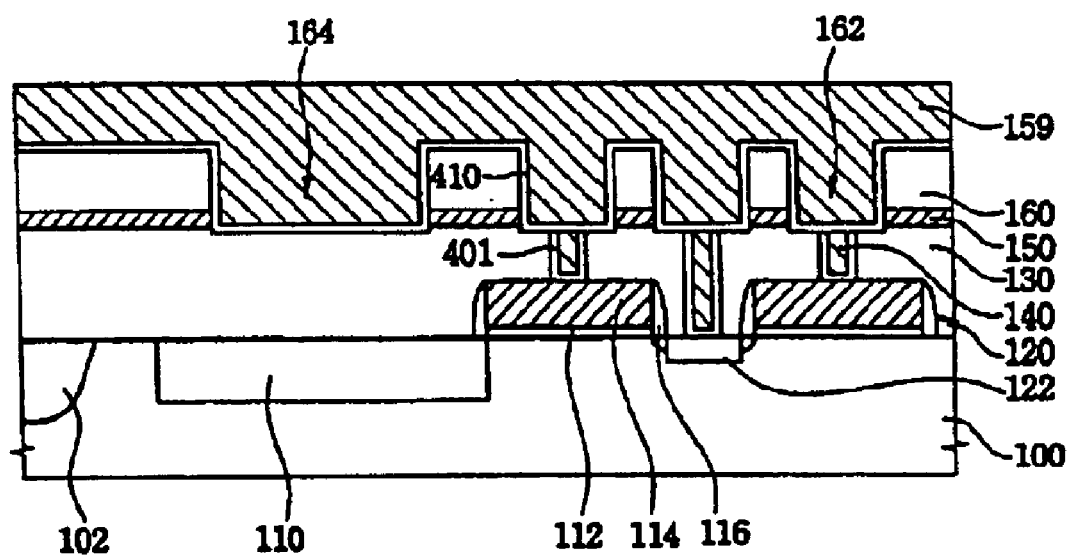

First dummy hole 164 and first trenches 162 are then etched in the second interlayer dielectric layer 160 and the first diffusion barrier layer 150, to be over the p/n photodiode 110 and the lower contacts 140, respectively, as shown in FIG. 2D. First trenches 162 and first dummy hole 164 are formed using known damascene techniques. A width of the bottom of the dummy hole 164 is made to be slightly smaller than a width of the photodiode 110. A second barrier metal layer 410 is formed on the second interlayer dielectric layer 160 and in the trenches 162 and dummy hole 164, as shown in FIG. 2E. Then, as shown in FIG. 2F, a first copper layer 159 is formed on the second barrier metal layer 410. The first copper layer 159 may be formed by first depositing a copper seed layer by sputtering, and then electroplating. Other methods, such as electroless plating, chemical vapor deposition, physical vapor deposition or a combination thereof may also be used to form the first copper layer 159.

Figure 2G:
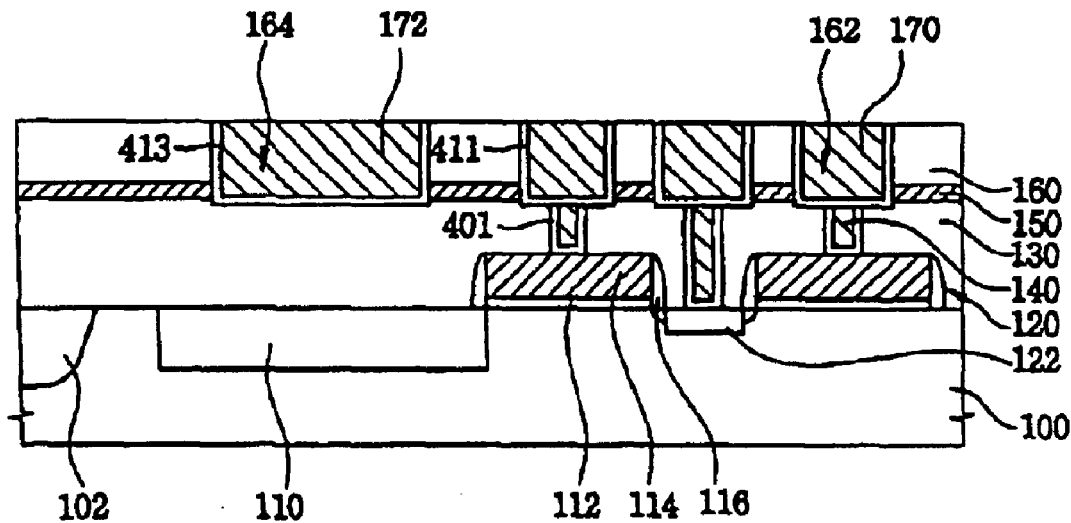

The first copper layer 159 is planarized by, for example, CMP to form first copper dummy pattern 172 and lower interconnections 170 in the first dummy hole 164 and first trenches 162, respectively, as shown in FIG. 2G. Second barrier metal layer 410 is also removed to expose an upper surface of the second interlayer dielectric layer 160, and to leave portions of the second barrier metal layer 413 and 411 in the first dummy holes 164 and the first trenches 162, respectively, to prevent diffusion of copper atoms into the surrounding interlayer dielectric layers.

Figure 2H:
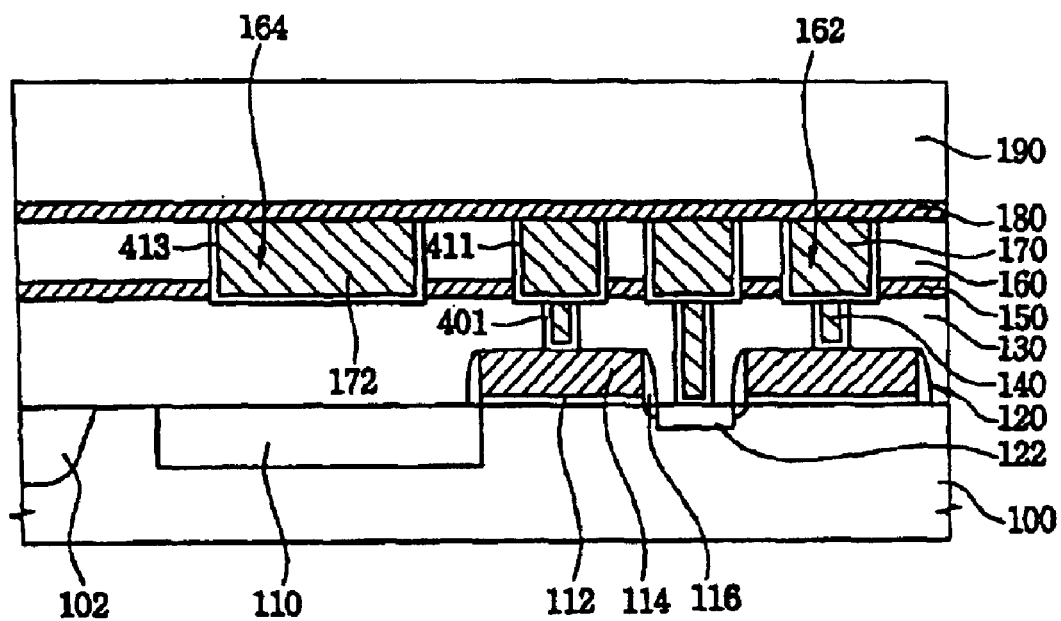

As illustrated in FIG. 2H, a second diffusion barrier layer 180 is then formed on the second interlayer dielectric layer 160, and a third interlayer dielectric layer 190 is formed on the second diffusion barrier layer 180. The height of the third interlayer dielectric layer 190 is preferably between 2,000 and 20,000 Å.

Figure 2I:
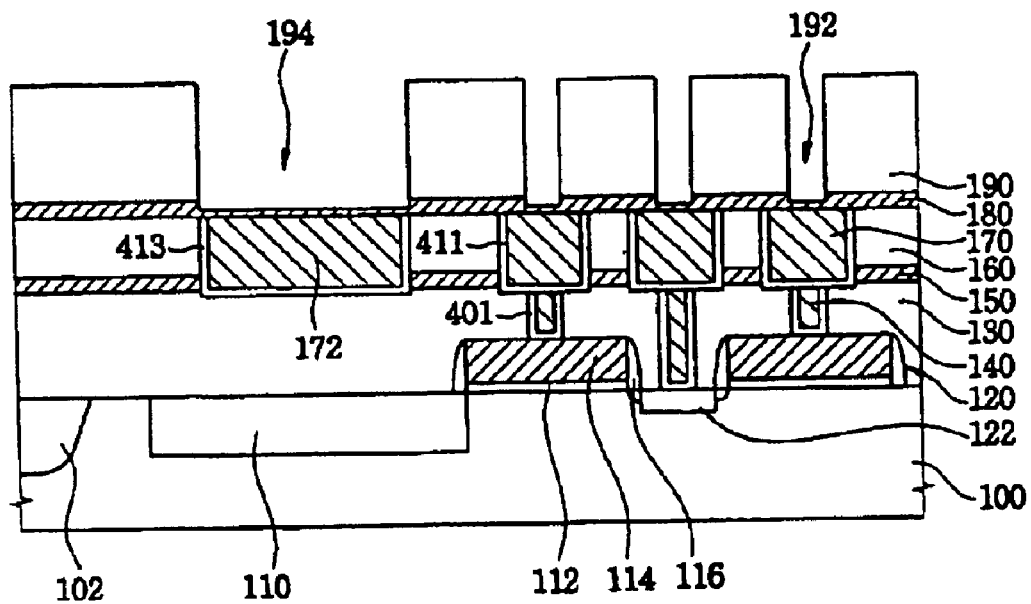

In FIG. 2I, the third interlayer dielectric layer 190 is patterned using known techniques, such as the use of a photoresist material to expose and define a via pattern. After development, the photoresist acts as a mask through which the dielectric material via pattern is removed, thereby forming pre-via holes 192. At the same time, a pre-dummy hole 194 is formed in the third interlayer dielectric layer 190 over the first copper dummy pattern 172. The second diffusion barrier layer 180 remains in the bottom of the second pre-via holes 192 and the second pre-dummy hole 194. This is because the etch selectivity of the third interlayer dielectric layer 190 is higher than that of the second diffusion barrier 180.

Figure 2J:
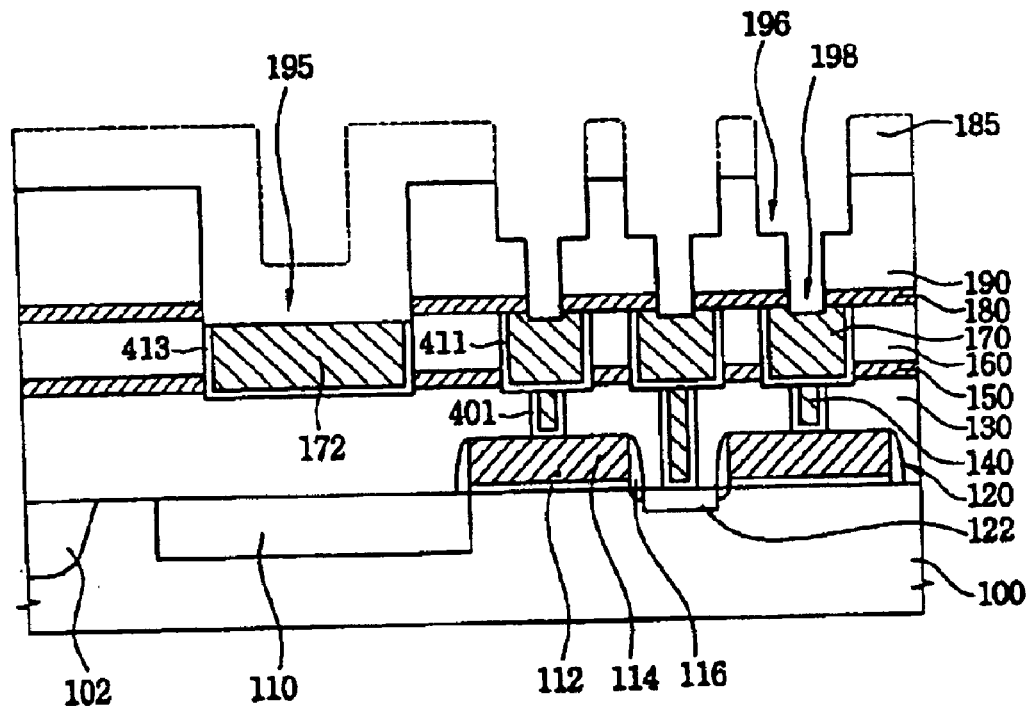

In FIG. 2J, the third interlayer dielectric layer 190 is again patterned using known techniques to form a second trench 196. If a photoresist is used, then after development, the photoresist acts as a mask through which the dielectric material of the trench pattern is removed. Preferably, the height of the trench 196 is 2,000~10,000 Å. The second diffusion barrier layer 180 is removed from bottoms of the pre-via holes 192 and pre-dummy hole 194 to thereby form second via holes 198 and second dummy hole 195.

In this embodiment, the pre-via hole 192 is formed first, and then a trench 196 and via holes 198 are formed. However, the trench may be formed first. Also, a single damascene method may be used to form the via holes 198 and the trench 196.

Figure 2K:
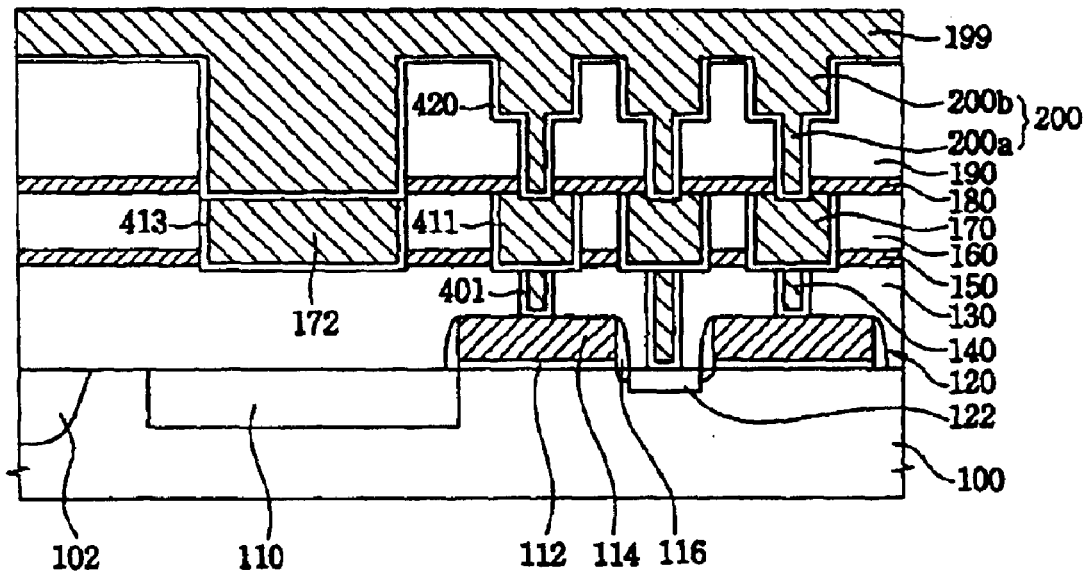

As shown in FIG. 2K, a third barrier metal layer 420 is then formed on the assembly by, for example, sputtering. A second copper layer 199 is then deposited on the assembly and in the dummy holes 195, via holes 198 and trenches 196.

Figure 2L:
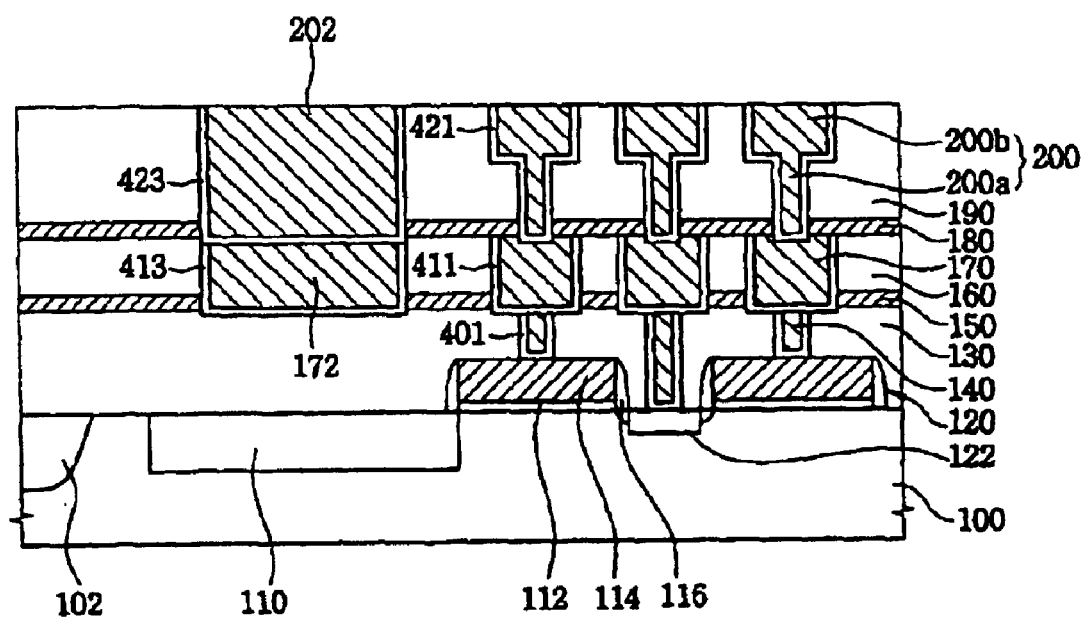

Then, in FIG. 2L, the second copper layer 199 is polished by, for example, CMP in a manner similar to that for the first copper layer 159 (as seen in FIG. 2G). At the same time, portions of the third barrier metal layer 420 are removed to expose an upper surface of the third interlayer dielectric layer 190. A second copper dummy pattern 202 and a first interconnection 200, made up of trenches 200b and vias 200a, are thereby formed on portions of the third barrier metal layer 423 and 421, respectively, as shown in FIG. 2J.

Figure 2M:
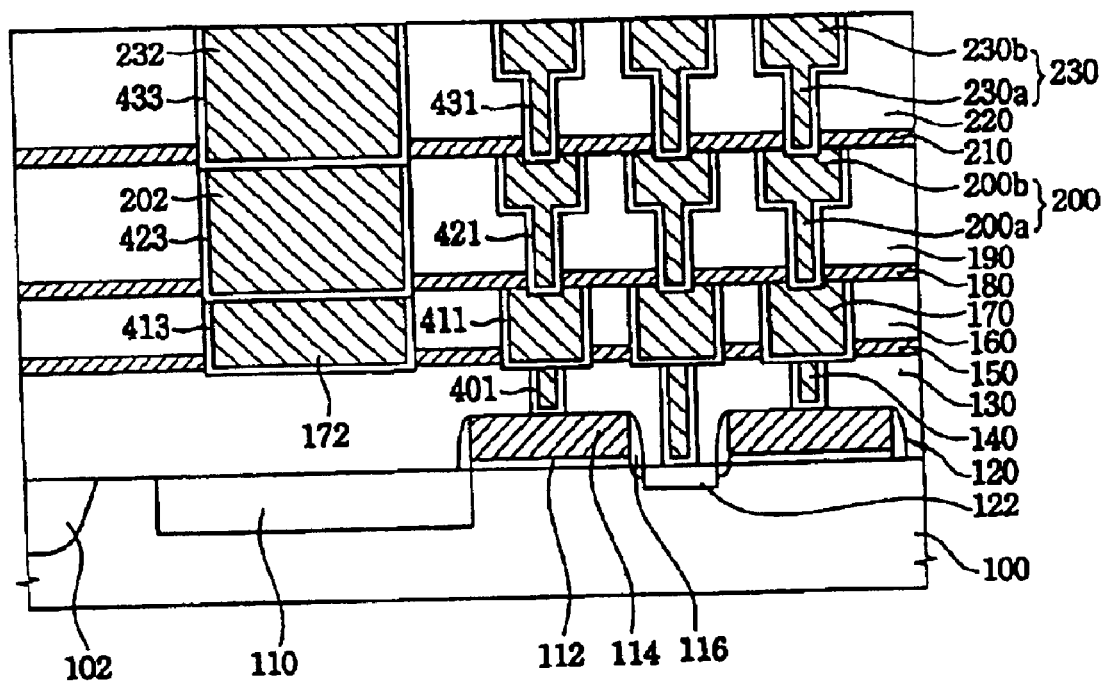

Referring to FIG. 2M, a third diffusion barrier layer 210 and a fourth interlayer dielectric layer 220 are sequentially formed on the third interlayer dielectric layer 190, and are patterned in a same manner as with the second diffusion barrier layer 180 and the third interlayer dielectric layer 190 as described above to form via holes, trenches and dummy holes (not shown). A fourth barrier metal layer (not shown) and a third copper layer (not shown) are then formed on the fourth interlayer dielectric layer 220 to fill the via holes, trenches and dummy holes. Forming the via holes, trenches and dummy holes is carried out in a same manner as with the third barrier metal layer 420 and second copper layer 199 as described above. The third copper layer is polished by, for example, CMP, and portions of the fourth barrier metal layer are removed to expose an upper surface of the fourth interlayer dielectric layer 220, thereby forming third copper dummy pattern 232 and second interconnection 230, made up of trenches 230b and vias 230a, on portions of the fourth barrier metal layer 433 and 431, respectively.

Figure 2N:
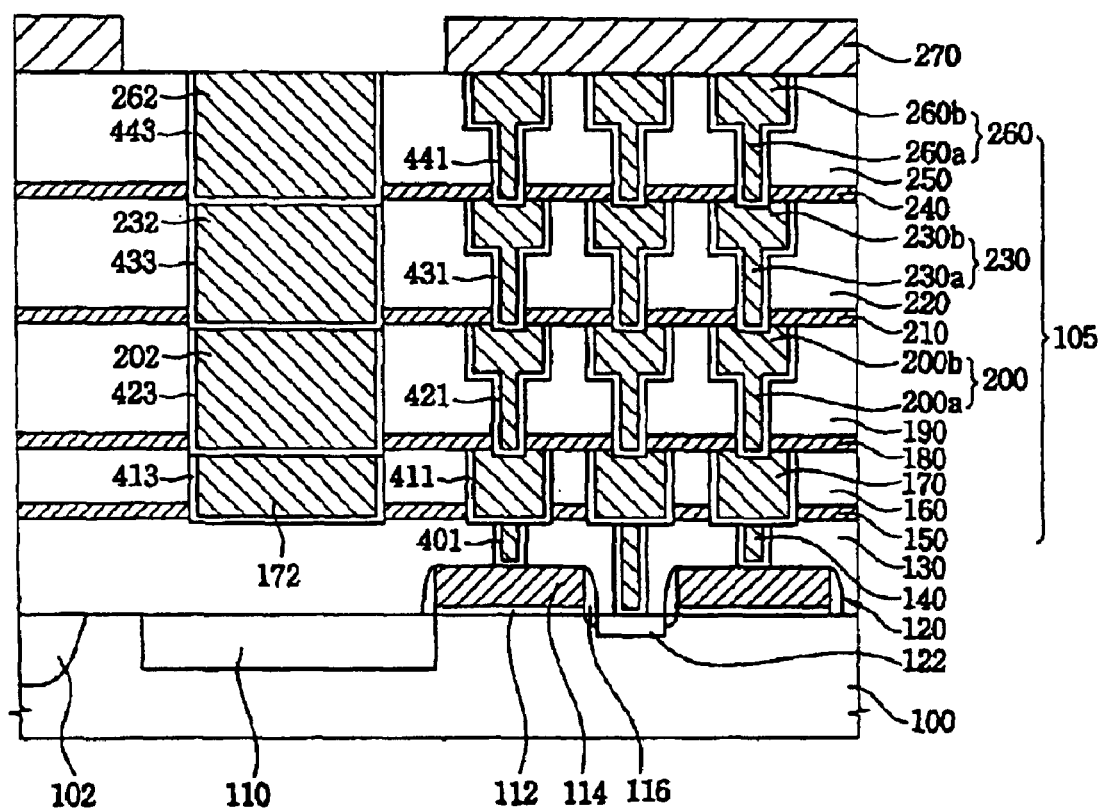
Figure 20:
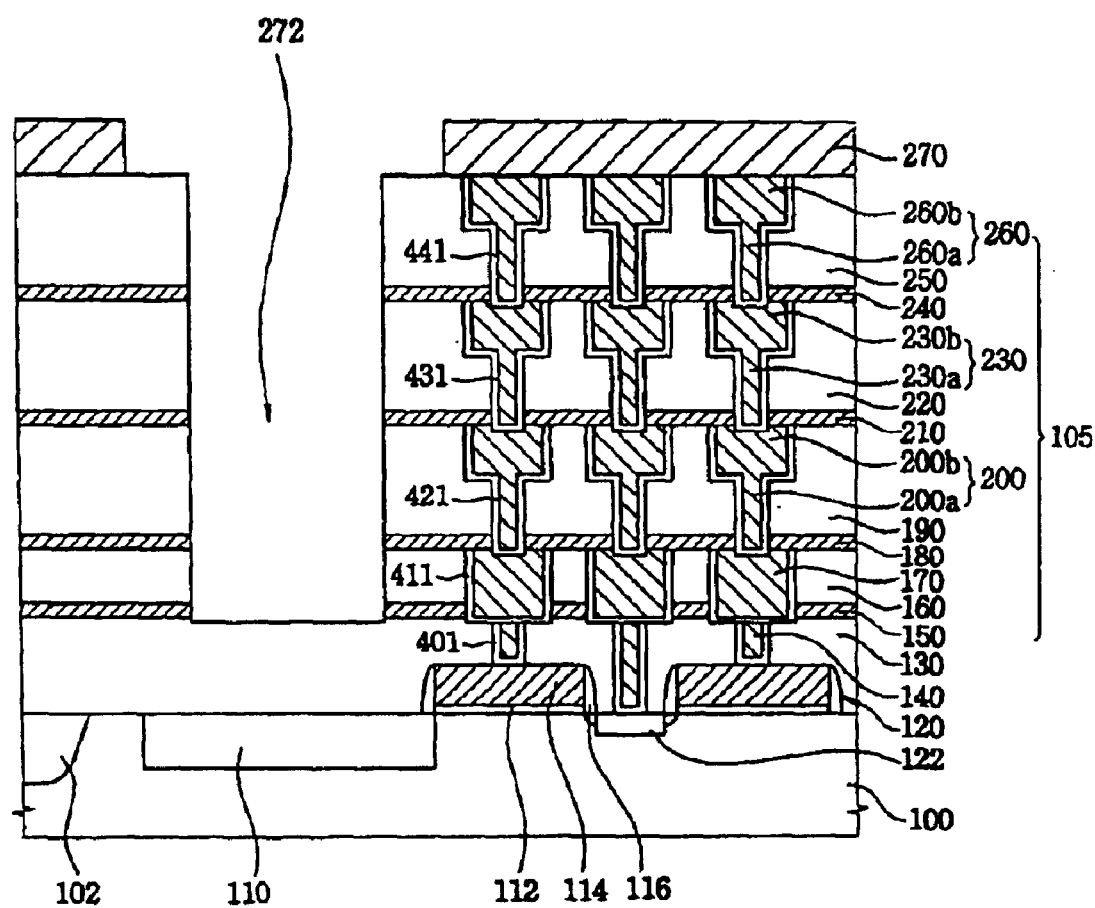

The process is repeated using a fourth diffusion barrier layer 240 and a fifth interlayer dielectric layer 250, which are patterned to form via holes, trenches and dummy holes (not shown). Then a fifth barrier metal layer (not shown) and a fourth copper layer (not shown) are formed on the fifth interlayer dielectric layer 250 to fill the via holes, trenches and dummy holes. The fourth copper layer is then polished by, for example, CMP and portions of the fifth barrier metal layer are removed to expose an upper surface of the fifth interlayer dielectric layer 250, thereby forming fourth copper dummy pattern 262 and third interconnection 260, made up of trenches 260b and vias 260a, on portions of the fifth barrier metal layer 443 and 441, respectively, as shown in FIG. 2N. The same process may be repeated until an interlayer dielectric structure having a predetermined number of layers is formed. When necessary, an interconnection structure having one to n, where n is an integer greater than 1, layers may be formed. After formation of the final copper dummy pattern and interconnection, a first protection layer 270 is formed on a surface of the copper interconnection in the uppermost interlayer dielectric layer, in this case, the third interconnection 260 and the fifth interlayer dielectric layer 250. The first protection layer 270 is patterned using known techniques such as with the use of a photoresist material. The first protection layer 270 may be formed of SiN or SiC. However, deposition rates of SiN and SiC are slow, and if SiN or SiC is deposited too thickly, cracks may occur due to stress. Therefore, $SiO_2$ on SiN or SiC may also be used, when SiN or SiC are inappropriate.

Referring now to FIG. 2O, the fourth to first copper dummy patterns, 262, 232, 202 and 172 (as shown in FIG. 2N) are etched by, for example, a wet etching technique, to thereby be removed from above the p/n photodiode 110 to form a light passageway 272. Portions of the fifth through second barrier metal layers 443, 433, 423, and 413 remaining at a bottom and sidewalls of the light passageway 272 are removed, so that light entering the light passageway 272 is not filtered before reaching the p/n photodiode 110.

Figure 2P:
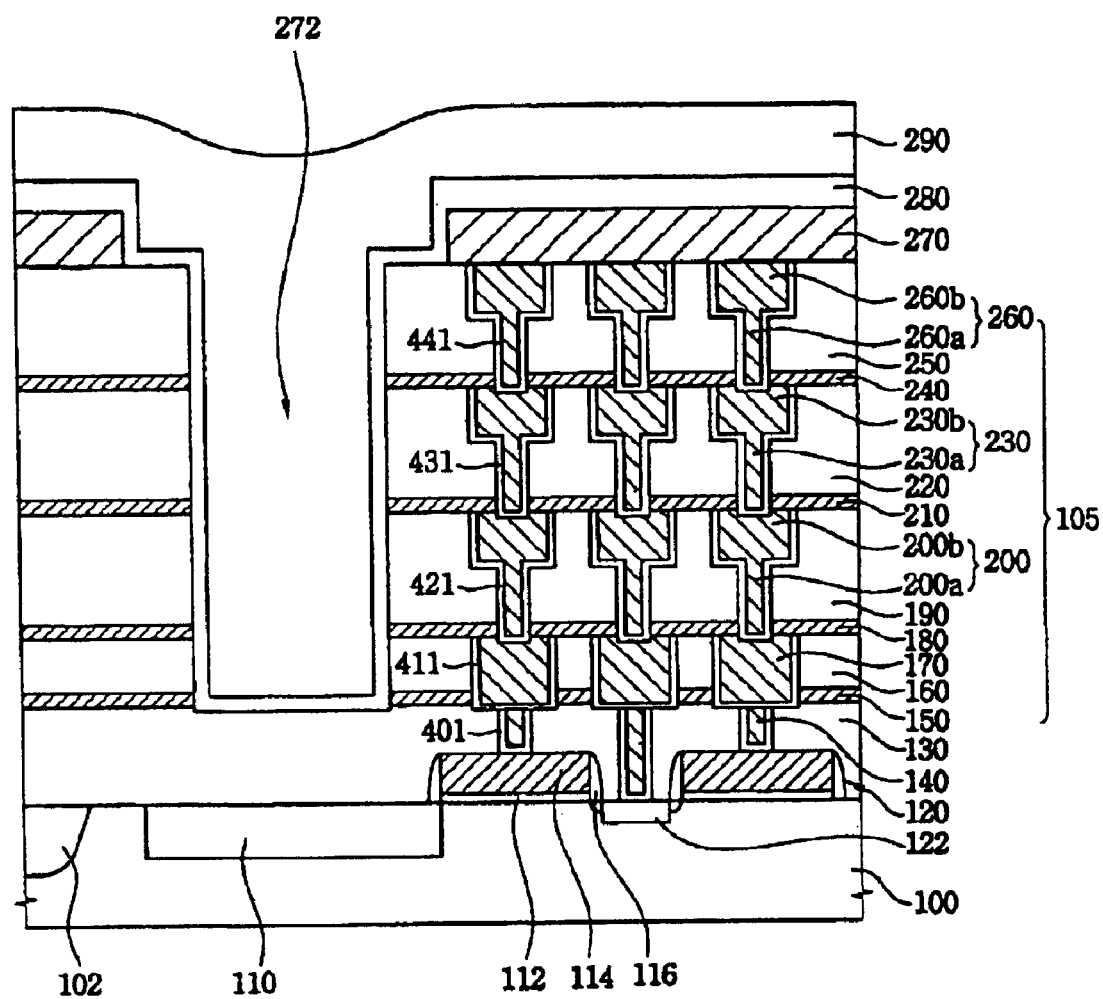

As illustrated in FIG. 2P, a second protection layer 280 may be formed over the first protection layer 270 and on the inner surface of the light passageway 272. The second protection layer 280 may be formed of a silicon oxide series material or an antireflective layer (ARL) such as SiON, SiC, SiCN or SiCO. When formed greater than about 200 Å thick, to be used as a copper diffusion barrier layer, SiOn, SiC, SiCN, or SiCO are opaque. Therefore, the second protection layer 280 is preferably formed thinner than the copper diffusion barrier layer, i.e., thinner than about 100 Å, so that the second protection layer 280 is not opaque. If the second protection layer 280 is formed of an ARL, a separate ARL layer is not needed. However, if the second protection layer is formed of an ARL, a portion thereof on the sidewalls of the light passageway will actually have a reflective property, and the antireflective property will be in the portion at the bottom of the light passageway. Then, the light passageway 272 is filled with a transparent material 290 such as a SOG (spin-on-glass) or a PR (photo resist).

Figure 2Q:
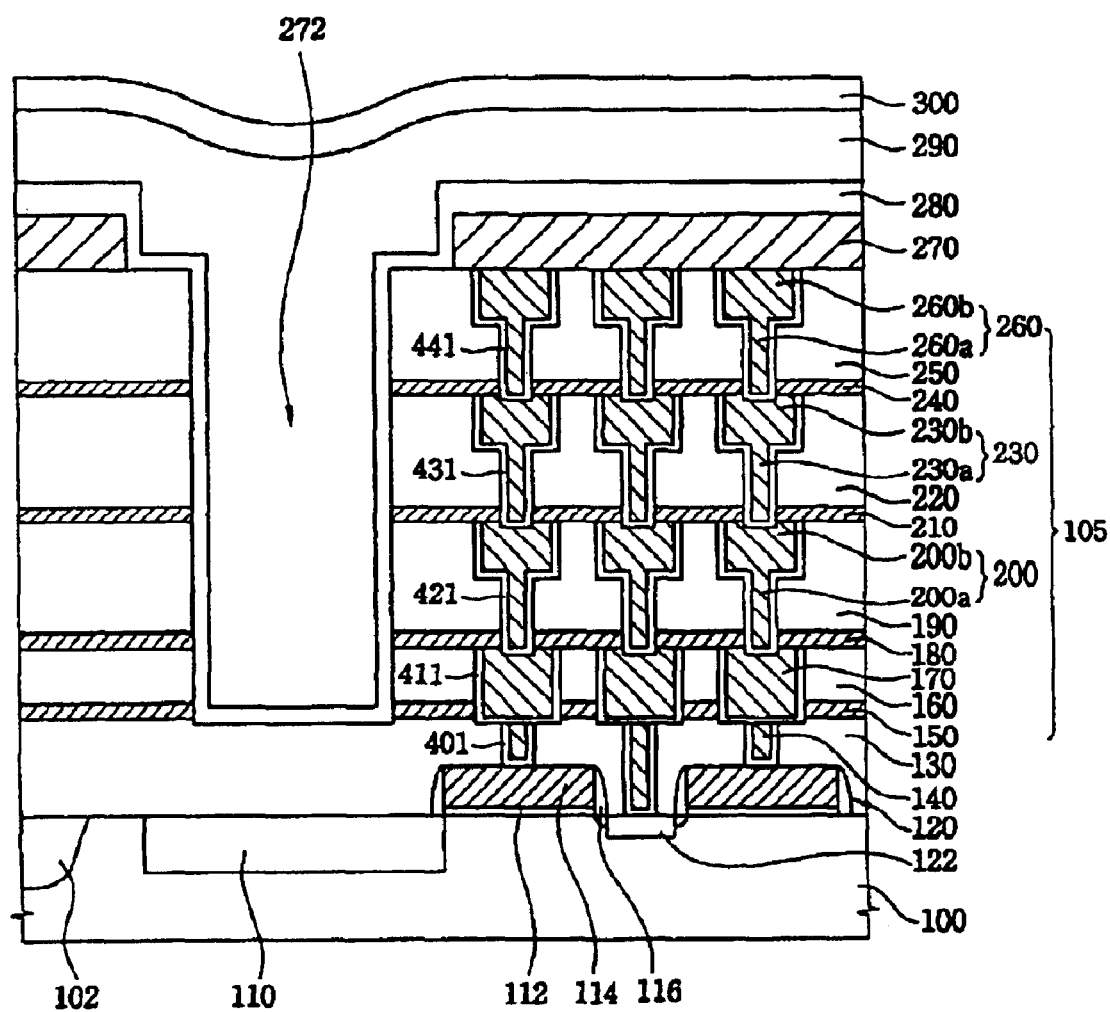
Figure 2R:
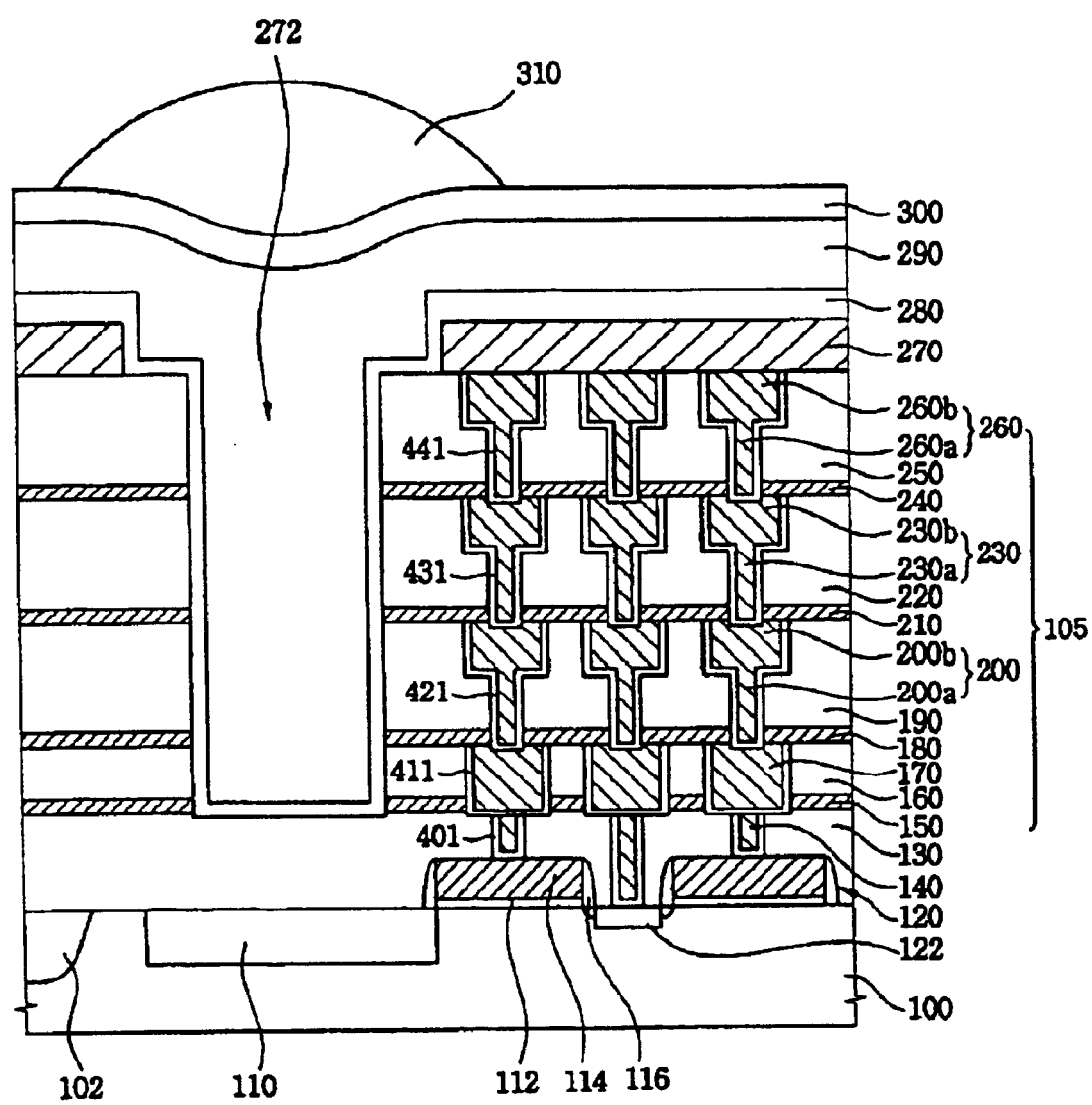

A color filter 300 is formed on the transparent fill material 290, as illustrated in FIG. 2Q. The color filter 300 may be formed of a photoresist material containing color dyes, e.g., red, green or blue. Then, a lens 310, which may be a convexly shaped micro lens, is formed on the color filter 300 over a light inlet of the light passageway 272, as illustrated in FIG. 2R.

As previously described, because copper atoms tend to diffuse into surrounding materials, a diffusion barrier layer is necessary to prevent such copper diffusion if copper is to be used as an interconnection material in an integrated circuit device. Typically, such a diffusion barrier layer is formed of SiN or SiC, which are opaque, and therefore must be removed from above the photodiode, which requires light to operate. Despite the disadvantages associated with a diffusion barrier layer that is necessary for preventing the diffusion of copper atoms into surrounding layers, copper is still preferable over other metals as a material for a contact structure.

Copper is an attractive material for use as an interconnection contact because its resistivity, which is around 1.7 $\mu\Omega$cm, is lower than that of aluminum alloy, which is around 3.2 $\mu\Omega$cm, and tungsten, which is greater than 15 $\mu\Omega$cm. Also, fewer metal layers are needed when using copper than other materials, and copper is more reliable than aluminum alloy, for example. The RC delay of a copper interconnection is shorter than that obtained with other metals, such as aluminum alloy. In short, the use of copper as an interconnection contact results in overall improved device performance.

The present invention, as previously described, allows a photodiode of an image sensor device to be formed having copper interconnections, thereby providing the capability of forming a semiconductor device pattern thickness below 0.13 $\mu$m, while simultaneously protecting underlying transistors from copper diffusion.

In a second embodiment of the present invention, a final structure is identical to the structure of the first embodiment, except that portions of the barrier metal layers remaining on sidewalls of the light passageway are not removed in the second embodiment. Also, the method of forming the image sensor device is different in the second embodiment of the present invention.

Figure 3:
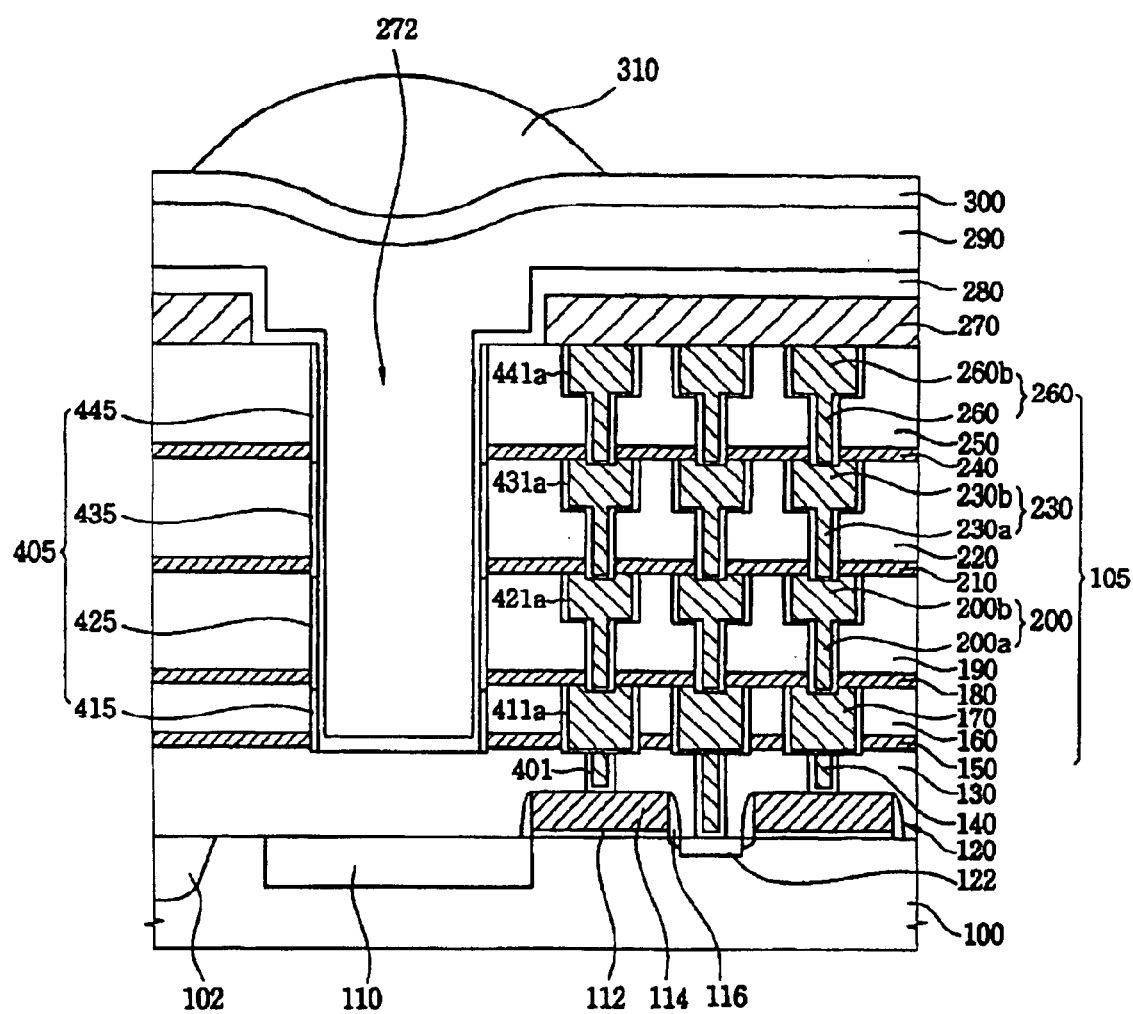
FIG. 3 illustrates a cross-sectional view of a photodiode image sensor device according to another embodiment of the present invention.

FIG. 3 illustrates an image sensor device according to a second and third embodiment of the present invention. As previously stated, the device illustrated in FIG. 3 is identical to that illustrated in FIG. 1, except that portions of barrier metal layers 415, 425, 435 and 445 remain on sidewalls of the light passageway 272 in the second and third embodiments.

Figure 4A:
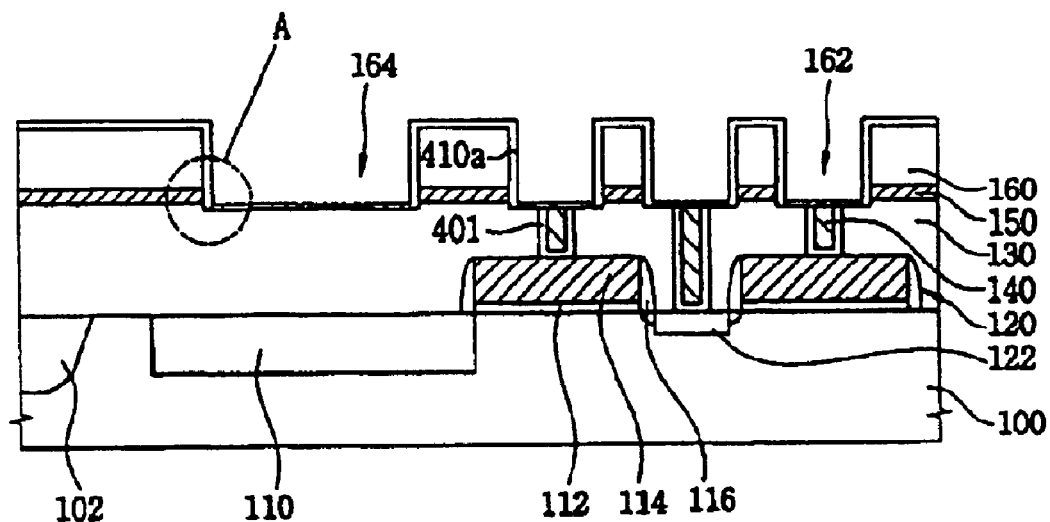
FIGS. 4A–4J illustrate cross-sectional views of the photodiode image sensor device illustrated in FIG. 3 at various stages of formation for showing a method for forming an image sensor device according to a second embodiment of the present invention.

Referring now to FIGS. 4A–4J, the image sensor device of the second embodiment is formed in a same manner as in the first embodiment up to the formation of the second barrier metal layer. That is, in the second embodiment, the steps leading up to and including forming the lower contacts 140, the first diffusion barrier layer 150, the second interlayer dielectric layer 160, the dummy holes 164 and the trenches 162 are the same as in the first embodiment, as illustrated in FIG. 4A. Then, a second barrier metal layer 410a is formed on the second interlayer dielectric layer 160 by RF resputtering with bias, such that portions of the barrier metal layer remaining at a bottom of the trenches 162 and dummy hole 164 are very thin. That is, by RF resputtering with bias, the barrier metal at the bottoms of the trenches 162 and dummy hole 164 is etched during the sputtering, and the etched material adheres to sidewalls of the trenches 162 and the dummy hole 164. Therefore, after the RF resputtering, there is very little barrier metal remaining on the bottoms of the trenches 162 and the dummy hole 164, as seen in FIG. 4A and in FIG. 5, which is an enlarged view of circular portion A of FIG. 4A.

Figure 4B:
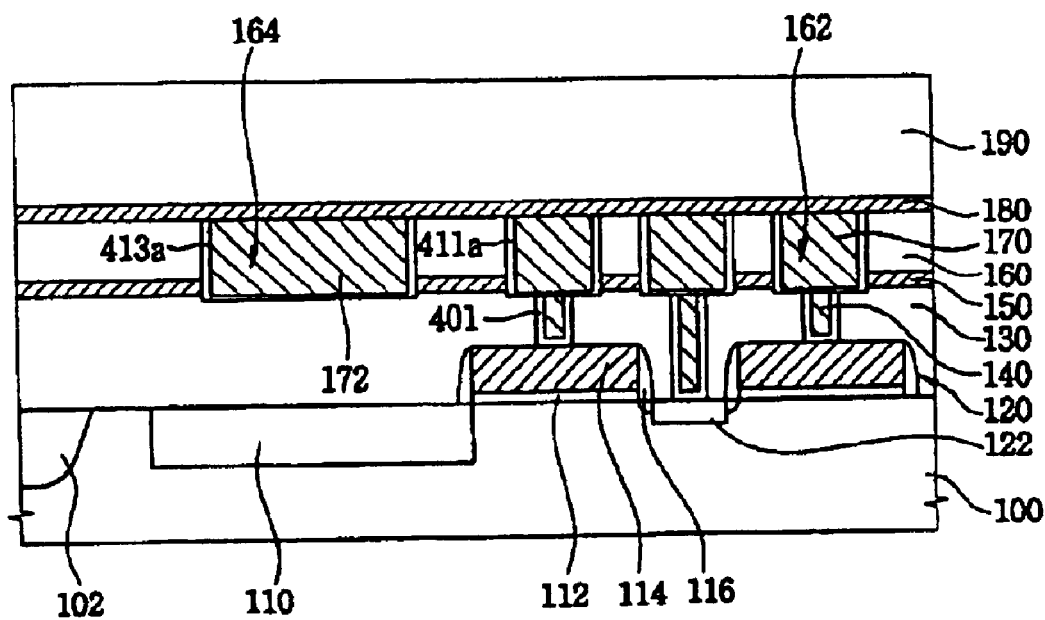

Then, as illustrated in FIG. 4B, a copper layer (not shown) is formed on the second interlayer dielectric layer 160 and in the trenches 162 and dummy hole 164. The copper layer is planarized and portions of the second barrier metal layer 410a are removed to expose an upper surface of the second interlayer dielectric layer 160, and to form a first copper dummy pattern 172 on a portion of the second barrier metal layer 413a remaining in the dummy hole 164 and lower interconnections 170 on a portion of the second barrier metal layer 411a remaining in the trenches 162. The planarization may be accomplished by, for example, CMP. Next, a second diffusion barrier layer 180 and a third interlayer dielectric layer 190 are sequentially formed on the second interlayer dielectric layer 160.

Figure 4C:
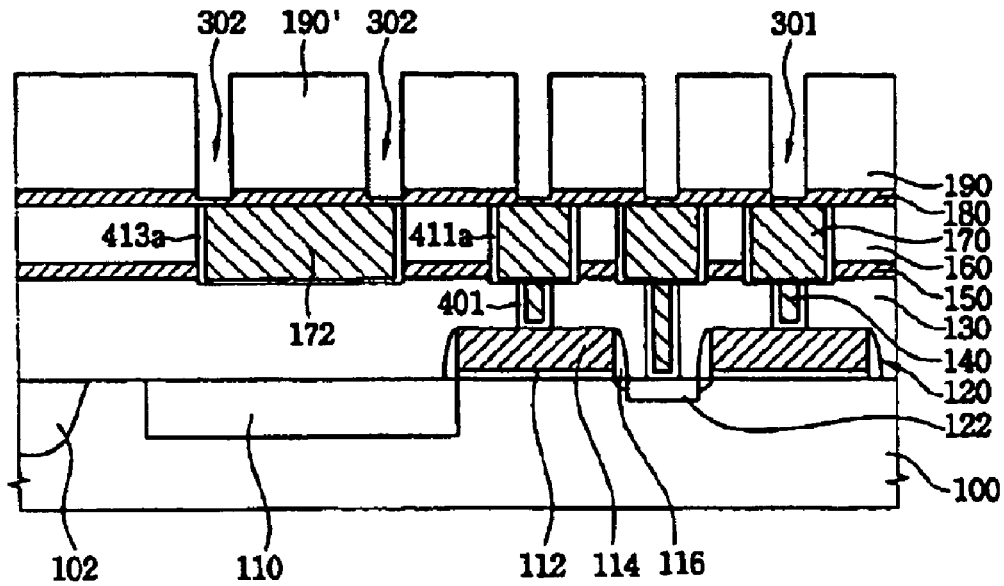

Pre-via holes 301 are formed in the third interlayer dielectric layer 190 over the lower interconnections 170 and pre-dummy holes 302 are formed over opposite ends of the first copper dummy pattern 172 to have similar widths, as illustrated in FIG. 4C. A portion of the third interlayer dielectric layer 190 remaining between the pre-dummy holes 302 serves as a first interlayer dielectric dummy pattern 190' over the p/n photodiode 110. The pre-dummy holes 302 are formed to have a same width as a width of the pre-via holes 301.

Figure 4D:
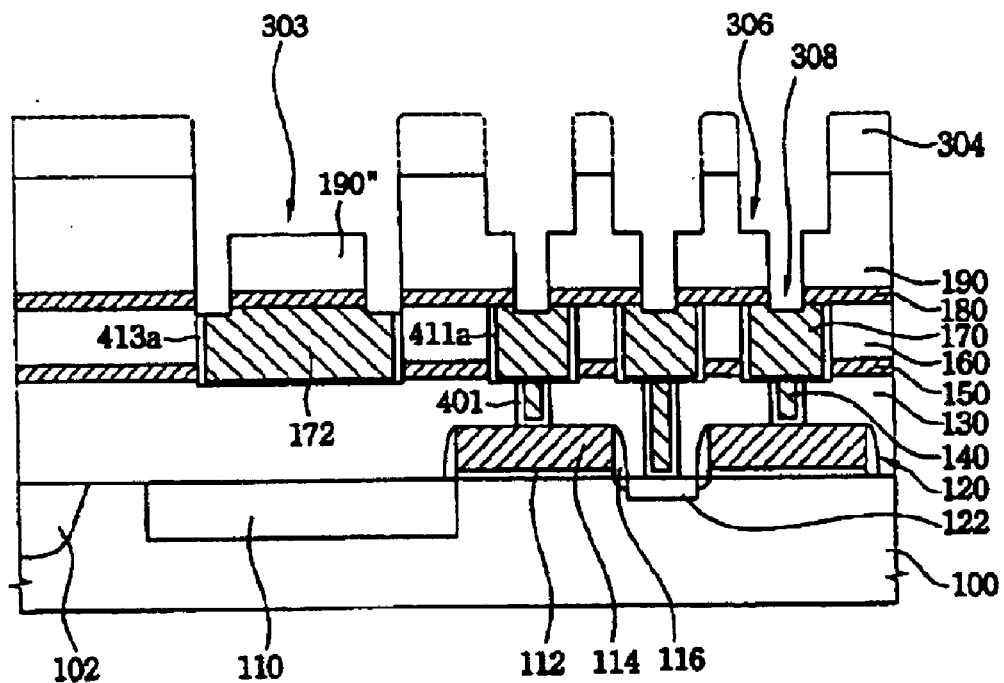

Referring to FIG. 4D, second diffusion barrier layer 180 is removed from bottoms of the pre-via holes 301 and the pre-dummy holes 302 by, for example, dry etching. A photoresist pattern 304 is formed on the third interlayer dielectric layer 190 to serve as a mask for etching the first interlayer dielectric dummy pattern 190' and the third interlayer dielectric layer 190, to form a dummy hole 303 having a second interlayer dielectric dummy pattern 190" formed therein and to form trenches 306 over via holes 308. The trenches 306 are formed to have a same depth as a height of the second interlayer dielectric layer dummy pattern 190".

Figure 4E:
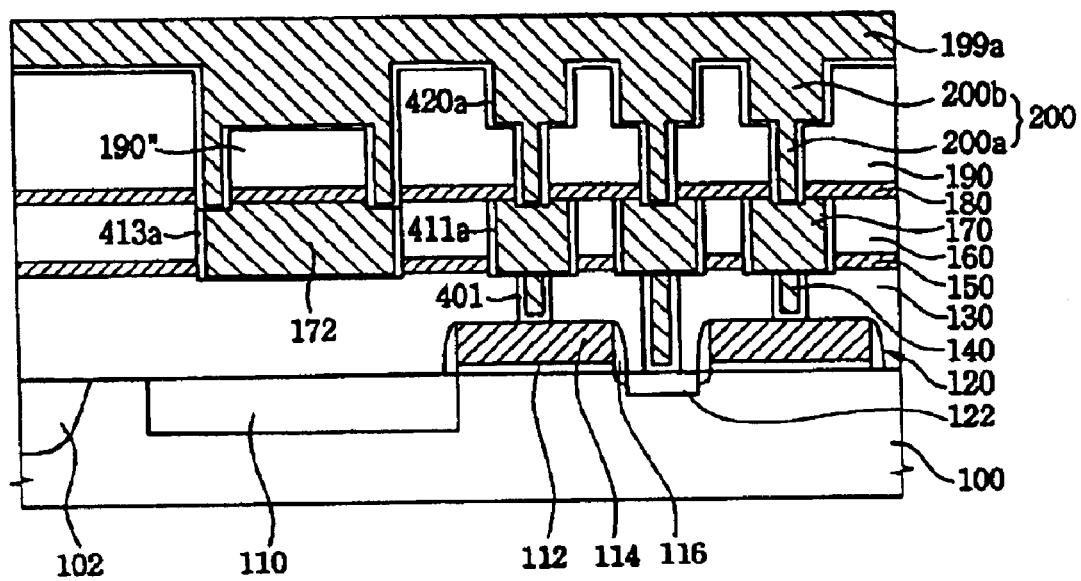

A third barrier metal layer 420a is then formed on the third interlayer dielectric layer 190 and in the dummy hole 303, the trenches 306 and the via holes 308. Because the width of the pre-dummy hole 302 is the same as the width of the pre-via holes 301, and because the width of the pre-dummy holes 302 and the pre-via holes 301 is small, the step coverage thereof is also small. Since the thickness of the barrier metal is the same in the pre-dummy holes 302 and the pre-via holes 301, the remaining barrier metal at the bottom may be easily controlled. A second copper layer 199a is then formed on the third barrier metal layer 420a to fill the dummy hole 303, the trenches 306 and the via holes 308, as illustrated in FIG. 4E.

Figure 4F:
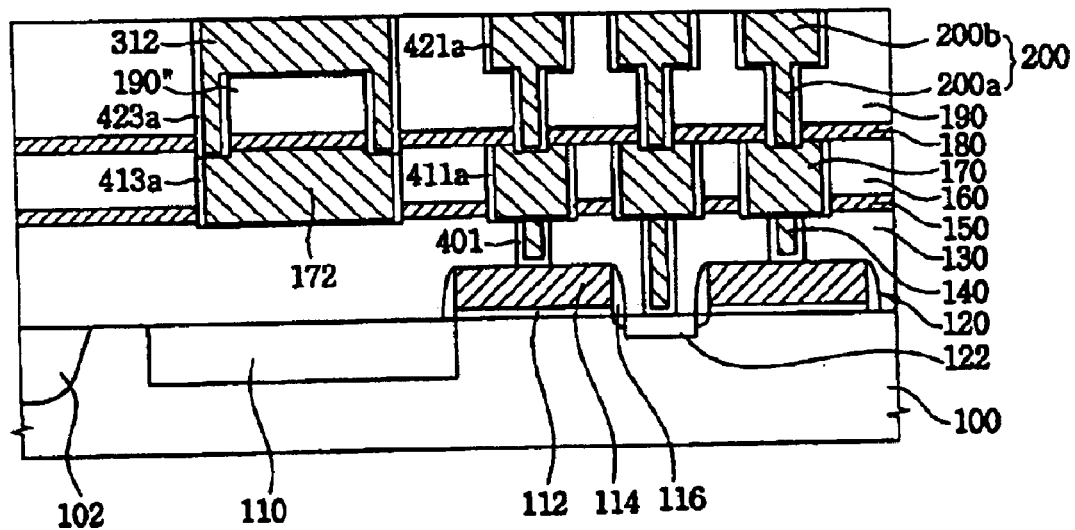

Thereafter, the second copper layer 199a is planarized by, for example, CMP to form first interconnections 200, as well as a second copper dummy pattern 312 on the second interlayer dielectric dummy pattern 190" and the first copper dummy pattern 172, as illustrated in FIG. 4F. Portions of the third barrier metal layer are also removed to expose an upper surface of the third interlayer dielectric layer 190. Because the interlayer dielectric dummy pattern 190" remains on the substrate in the second embodiment, the thickness of the second copper layer 199a may be reduced over the thickness of the second copper layer of the first embodiment. Reducing the thickness of the second copper layer and subsequent copper layers reduces the complexity of the planarization process, e.g., chemical mechanical polishing process, that is necessary for forming the first interconnections 200 and second copper dummy pattern 312.

Figure 4G:
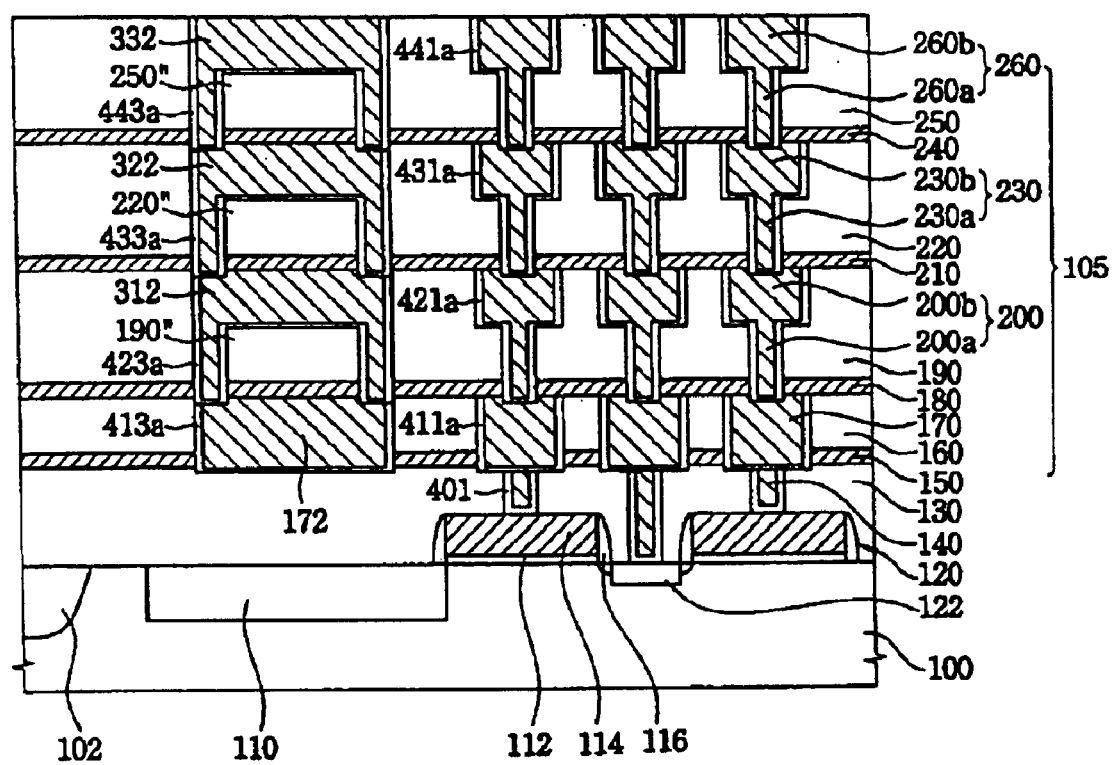
Figure 5:
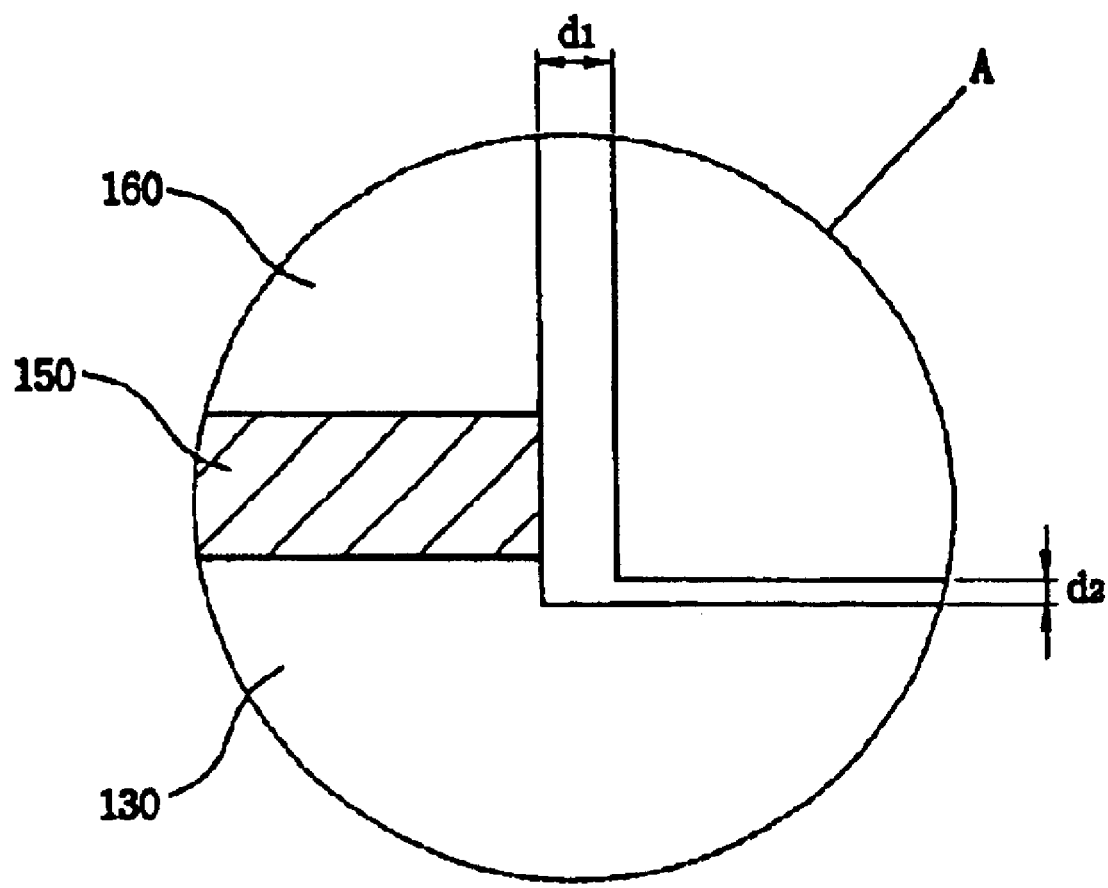
FIG. 5 illustrates an enlarged view of section "A" of FIG. 4A.

Additional diffusion barrier layers, interlayer dielectric layers, barrier metal layers and copper layers are then formed using the same technique as that described above for the second embodiment to produce a structure such as that illustrated in FIG. 4G, having first, second, third and fourth copper dummy patterns, 172, 312, 322 and 332, respectively formed on portions of barrier metal layers 413a, 423a, 433a, and 443a, first through third interlayer dielectric dummy patterns 190", 220", and 250", contacts 140, and interconnections 170, 200, 230, and 260, respectively formed on portions of barrier metal layers 411a, 421a, 431a, and 441a. If the contacts 140 are formed of copper, portions of a barrier metal layer 401 may be formed in the contact holes to prevent copper diffusion into the first interlayer dielectric layer 130 and transistors 120. In the second embodiment, the barrier metal layer remaining between the copper dummy patterns 172, 312, 322 and 332 is either very thin, e.g., 10s to 100s of Angstroms, or is completely removed by an RF resputtering process, as shown in FIG. 5. Therefore, the copper dummy patterns 172, 312, 322 and 332 may be removed in a single step, as described below.

Figure 4H:
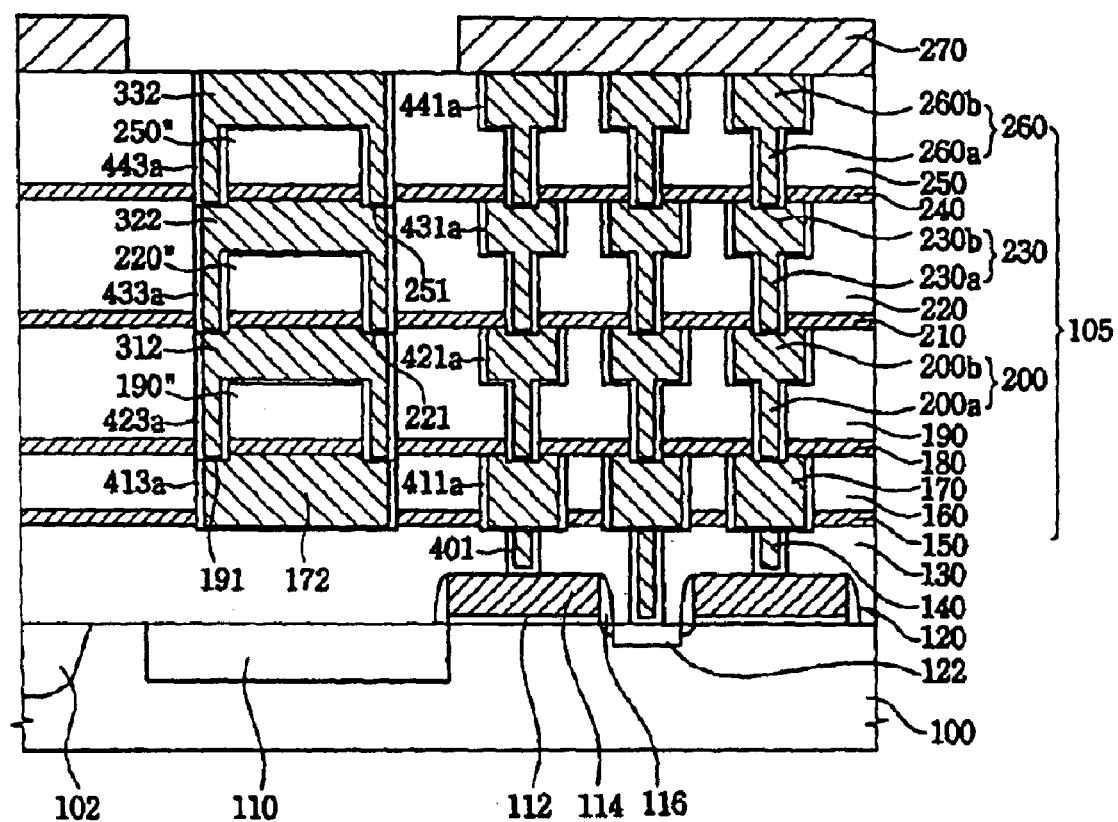
Figure 4I:
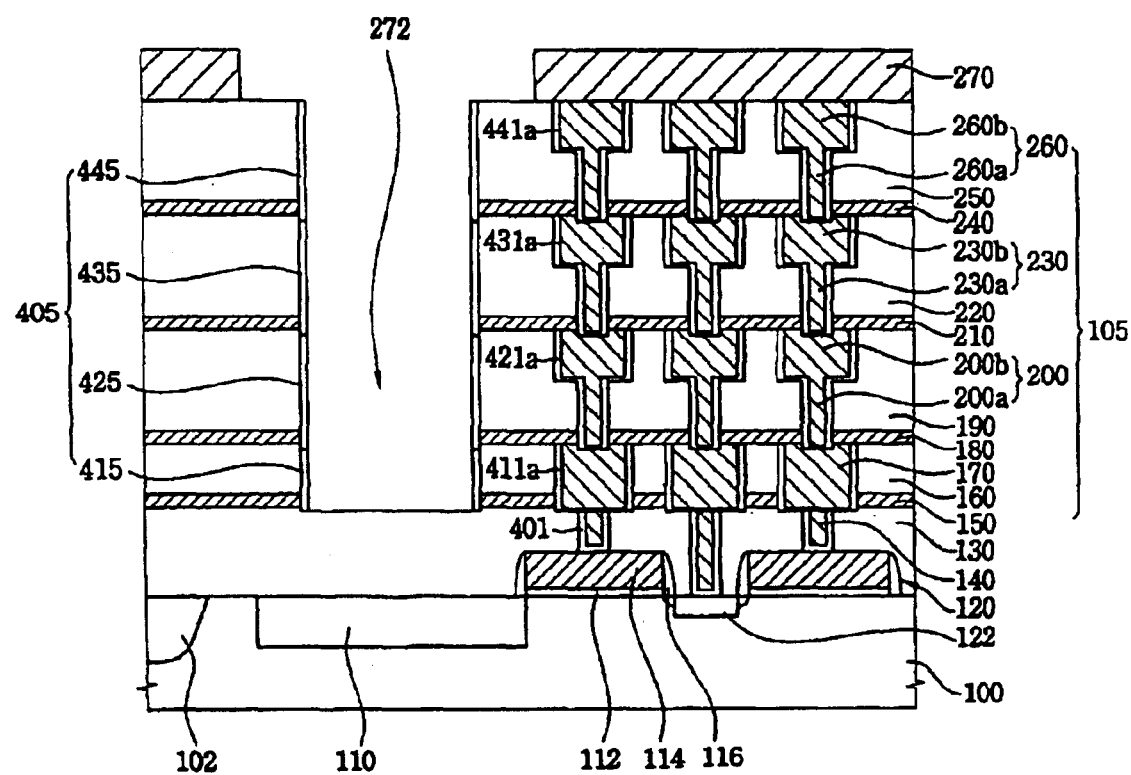

As illustrated in FIG. 4H, a first protection layer 270 is formed on the third copper interconnections 260 in the uppermost interlayer dielectric layer 250. Then, the fourth through first copper dummy patterns, 332, 322, 312 and 172, and the first through third interlayer dielectric dummy patterns 190", 220", and 250", are removed in a single step by performing a wet etching process, as shown in FIG. 4I, to form a light passageway 272. Portions of barrier metal layers 415, 425, 435, and 445 remain on sidewalls of the light passageway 272, to form a barrier metal layer 405 only on sidewalls of the light passageway 272. By having the barrier metal layer 405 only on sidewalls of the light passageway 272, and not on a bottom thereof, light incident on the p/n photodiode 110 is not blocked by barrier metal before reaching the p/n photodiode 110. Also, a step coverage difference between the bottom of the trenches 200b, 230b, and 260b and vias 200a, 230a, and 260a, as shown in FIGS. 4E–4J, and between an upper side of interlayer dielectric dummy patterns 190", 220", and 250" and the bottom of both sides of the interlayer dielectric dummy patterns 191, 221 and 251, is about 7:4. Therefore, if the trenches 200b, 230b, and 260b, vias 200a, 230a, and 260a, upper sides of the interlayer dielectric dummy patterns 190", 220", and 250" and the bottoms of both sides of interlayer dielectric dummy patterns 190, 221 and 251 are etched by a factor of about 4 during RF resputtering, a ratio of about 3 of the barrier metal should remain on the trenches 200b, 230b, and 260b and upper sides of the interlayer dielectric dummy patterns, 190", 220" and 250", and no barrier metal should remain on the vias 200a, 230a, and 260a and the bottoms of both sides of the interlayer dielectric dummy patterns, 191, 221 and 251. In this manner, resistance in the vias may be reduced.

Figure 4J:
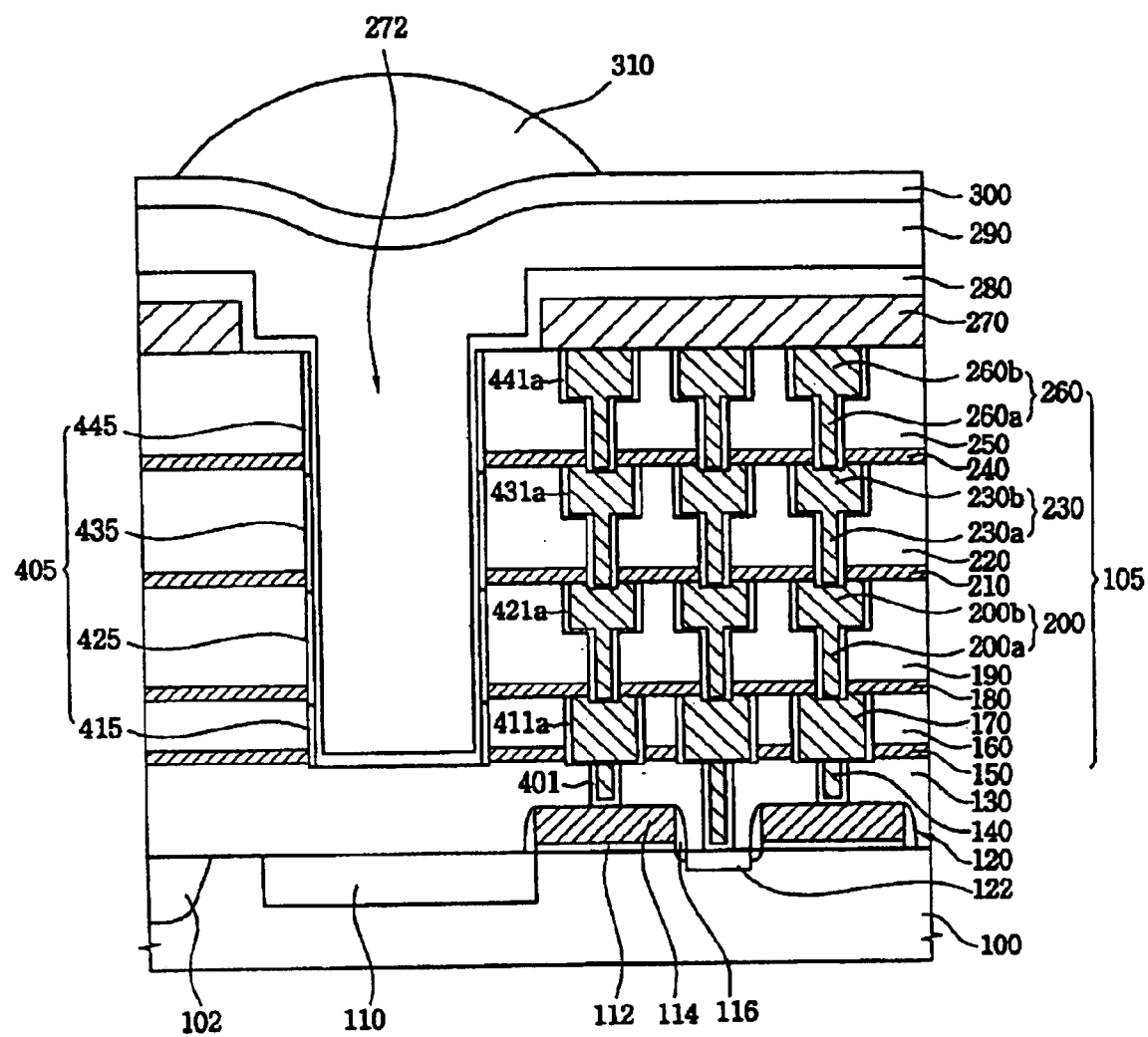

The remaining steps of forming the optional second protection layer 280, the transparent material 290, the color filter 300 and the lens 310, are the same as those for the first embodiment, and the resulting structure is illustrated in FIG. 4J.

Figure 6A:
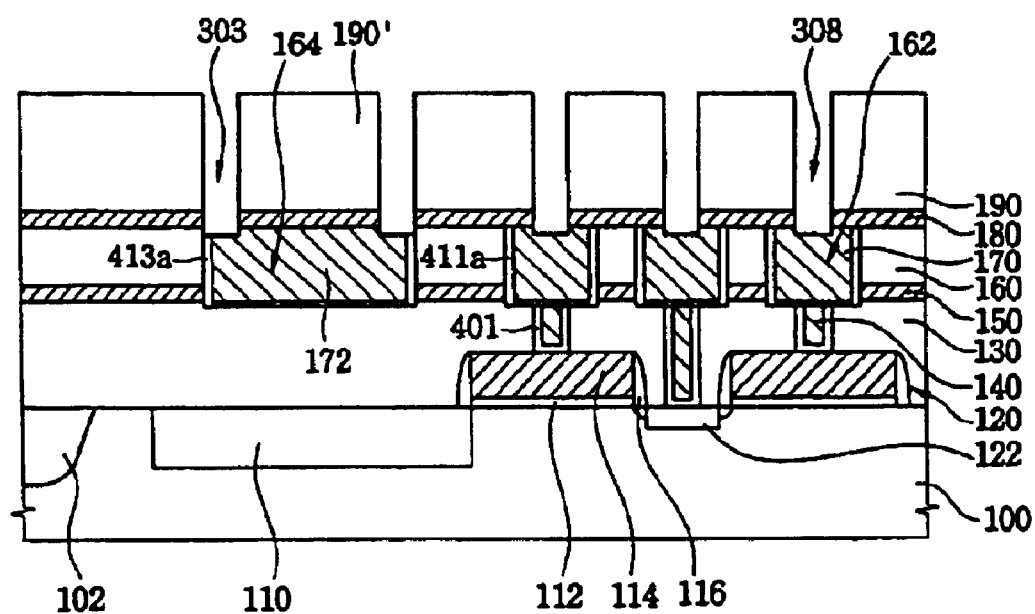
FIGS. 6A–6H illustrate cross-sectional views of the photodiode image sensor device illustrated in FIG. 3 at various stages of formation for showing an alternate method for forming an image sensor device according to a third embodiment of the present invention.

A third embodiment of the present invention is the same as the second embodiment, except in the formation of the dummy patterns. In the third embodiment, steps up to and including forming the via holes 308, dummy holes 303 and first interlayer dielectric dummy pattern 190' are the same as in the second embodiment as illustrated in FIG. 6A.

Figure 6B:
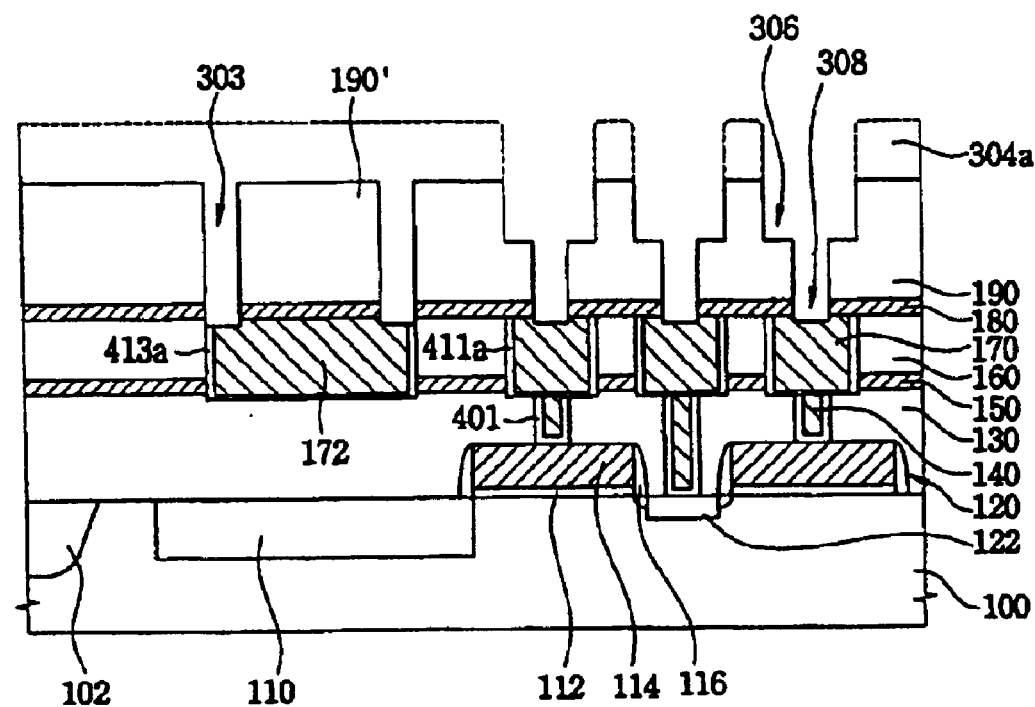

However, in the third embodiment as illustrated in FIG. 6B, a photoresist pattern 304a is formed on the third interlayer dielectric layer 190 and the first interlayer dielectric dummy pattern 190', to serve as a mask for etching the third interlayer dielectric layer 190 to form trenches 306. The first interlayer dielectric dummy pattern 190' is not etched to a same depth as the trenches 306, as is the case in the second embodiment as shown in FIG. 4D.

Figure 6C:
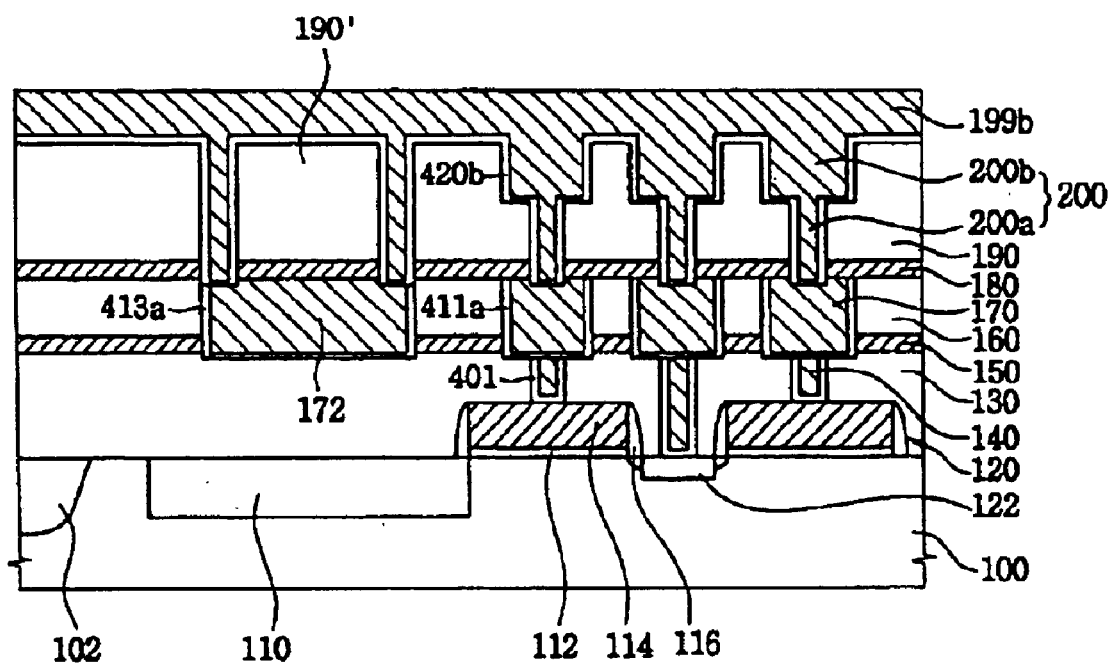
Figure 6D:
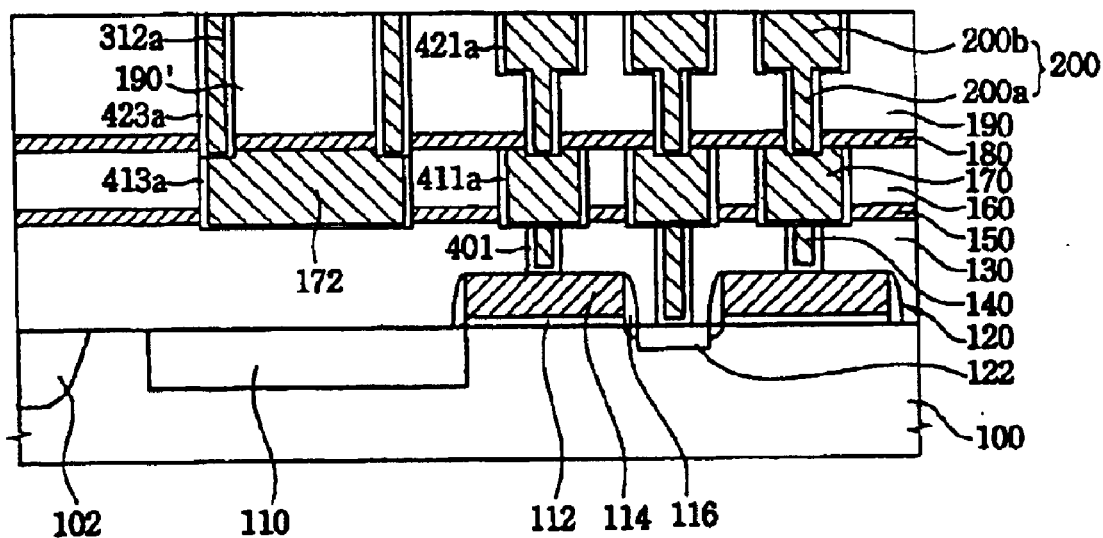

In FIG. 6C, a third barrier metal layer 420b is formed on the third interlayer dielectric layer 190 and in dummy holes 303, trenches 306 and via holes 308, and a second copper layer 199b is then formed on the third barrier metal layer 420b to fill the dummy holes 303, the trenches 306 and the via holes 308. Then, as illustrated in FIG. 6D, the second copper layer 199b is planarized and portions of the second barrier metal layer 420b are removed in the same manner as that of the second embodiment to expose an upper surface of the third interlayer dielectric layer 190, and to form first interconnections 200 formed of trenches 200b and vias 200a, on a portion of barrier metal layer 421a and a second copper dummy pattern 312a on a portion of the barrier metal layer 423a.

Figure 6E:
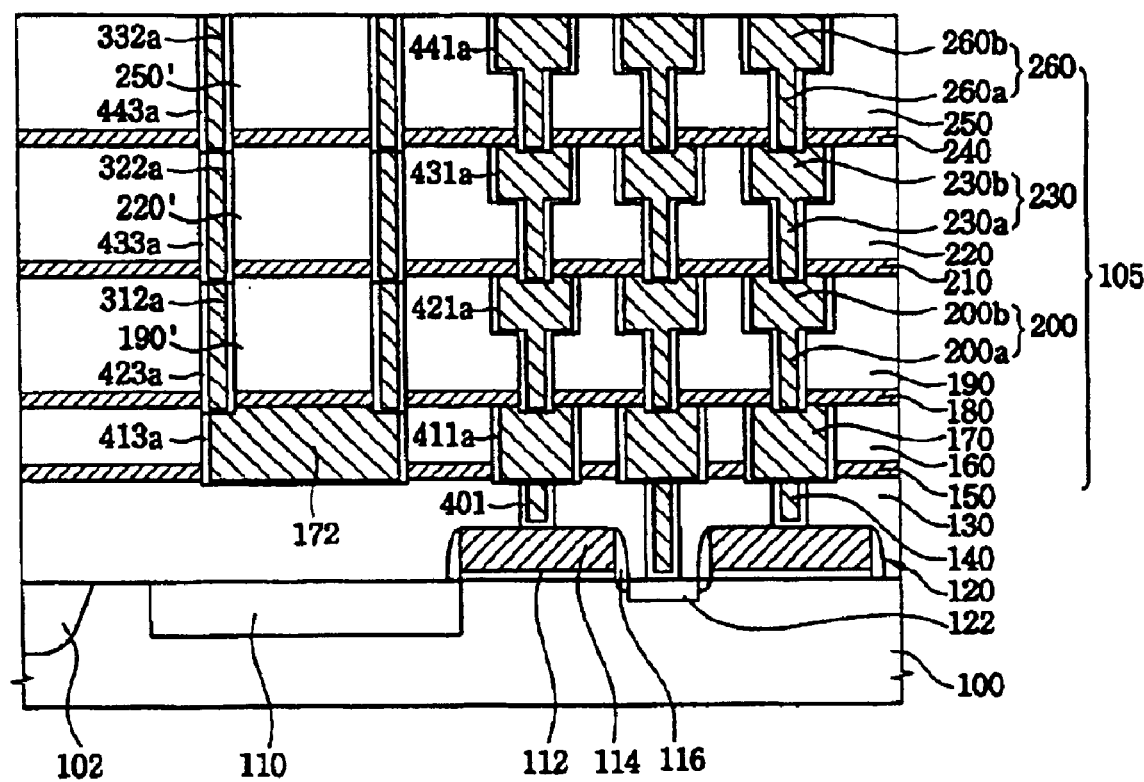

Then, a second interlayer dielectric dummy pattern 220', a third copper dummy pattern 322a, second interconnections 230 formed of trenches 230b and vias 230a, a third interlayer dielectric dummy pattern 250', a third copper dummy pattern 332a and third interconnections 260 formed of trenches 260b and vias 260a, are formed in a manner similar to that of the first interlayer dielectric dummy pattern 190', the second copper dummy pattern 312a, and the first interconnections 200, as illustrated in FIG. 6E. The third and fourth copper dummy patterns 322a and 332a are formed in portions of barrier metal layers 433a and 443a, respectively, and the second and third interconnections 230 and 260 are formed in portions of barrier metal layers 431a and 441a, respectively.

Figure 6F:
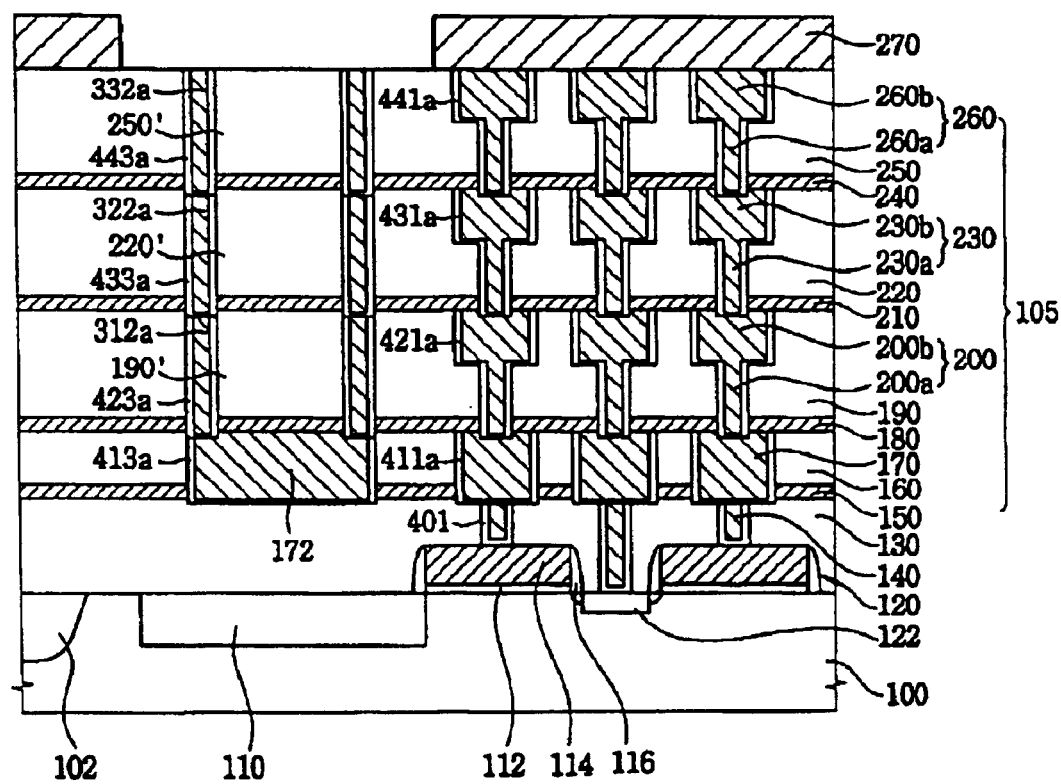
Figure 6G:
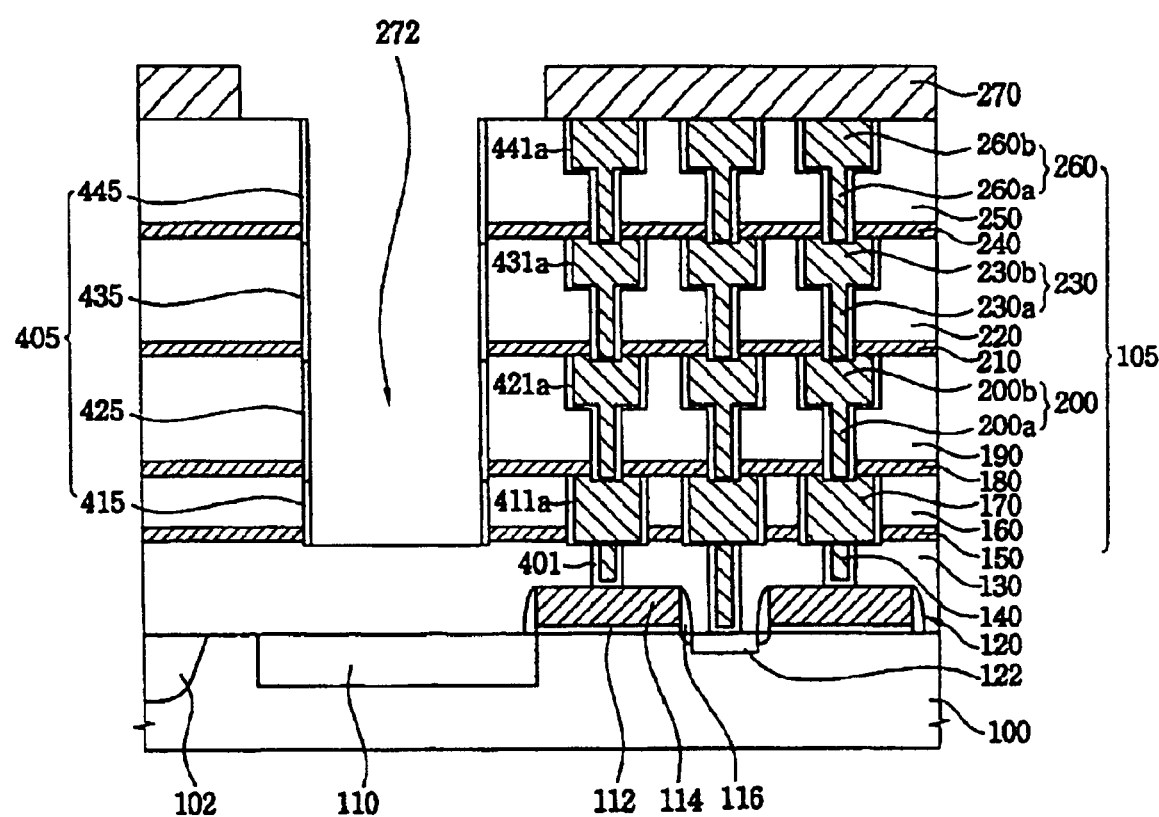

In the third embodiment, after forming a first protection layer 270 on the third interconnections 260 as shown in FIG. 6F, the fourth copper dummy pattern 332a, the third copper dummy pattern 322a, the second copper dummy pattern 312a and the first copper dummy pattern 172a are etched by a wet etching process, in a solution of, for example, 5% to 10% $H_2SO_4$, 5% $H_2O_2$, and 5% $H_2O$. The wet etching process allows interlayer dielectric dummy patterns 190', 220' and 250' to be separated and removed as a single piece when the copper dummy patterns are removed, as illustrated in FIG. 6G, to thereby form light passageway 272. In the third embodiment, portions of barrier metal layers 415, 425, 435 and 445, which comprise a barrier metal layer 405, are allowed to remain on the sidewalls only of the light passageway 272.

Figure 6H:
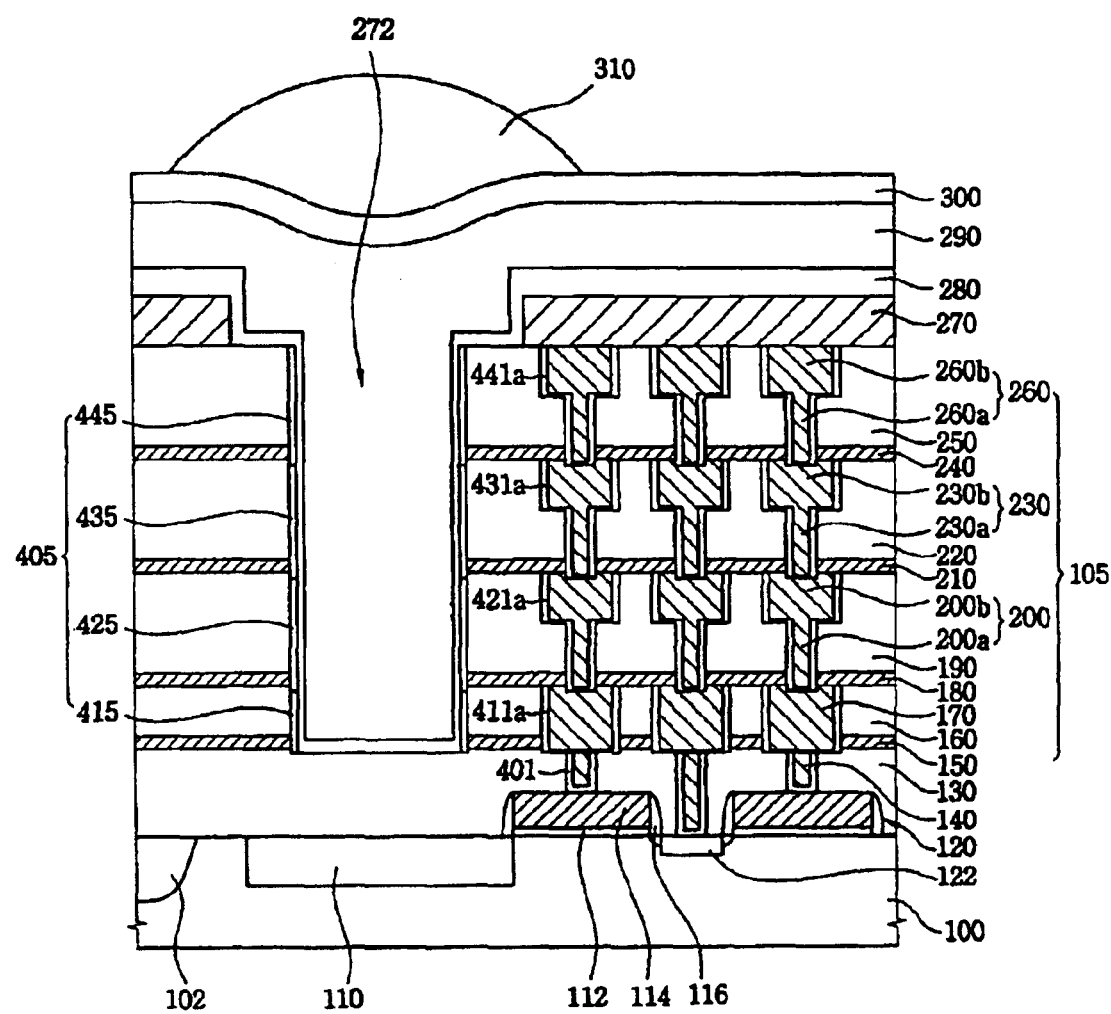

The remaining procedures for forming the optional second protection layer 280, the transparent fill layer 290, the colored filter 300 and the lens 310 may be the same as in the first embodiment, as illustrated in FIG. 6H.

In a fourth embodiment of the present invention, no copper dummy pattern is formed in the interlayer dielectric layers. Other than this distinction, the method for forming the image sensor device according to the fourth embodiment of the present invention is similar to that of the previously described first, second and third embodiments.

Figure 7A:
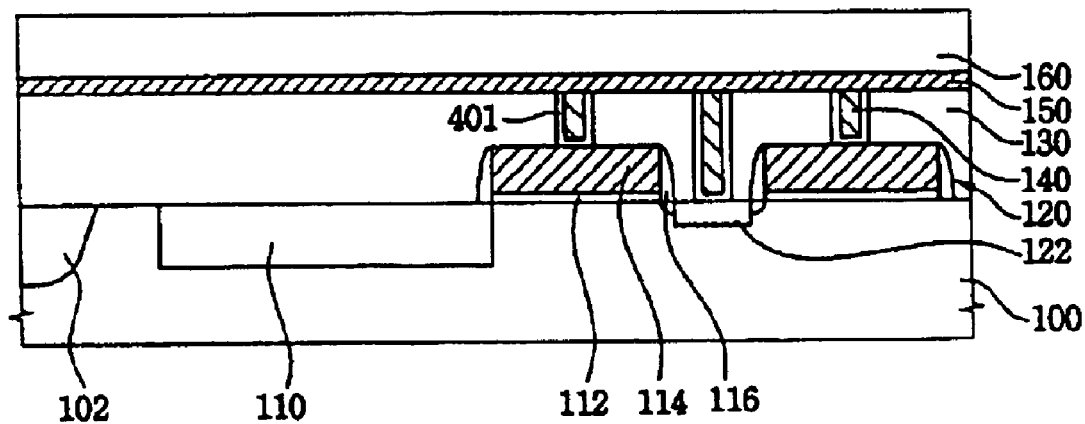
FIGS. 7A–7H illustrate cross-sectional views of the photodiode image sensor device illustrated in FIG. 1 at various stages of formation for showing an alternate method for forming an image sensor device according to a fourth embodiment of the present invention.

According to the fourth embodiment of the present invention, a p/n photodiode 110, is formed in a semiconductor substrate 100, an isolation region 102 is formed in the semiconductor substrate 100 to a first side of the p/n photodiode 110, and a plurality of transistors 120 are formed on the semiconductor substrate 100 to a second side of the p/n photodiode 110. Each transistor 120 includes a gate insulating layer 112, a gate electrode 114, a source/drain region 122 and spacers 116. A first interlayer dielectric layer 130 is formed of a transparent material such as a silicon oxide on the substrate 100. Lower contacts 140 formed on a portion of a barrier metal layer 401, a first diffusion barrier layer 150, and a second interlayer dielectric layer 160 are formed on the substrate 100 in the same manner as that of the first embodiment, as illustrated in FIG. 7A.

Figure 7B:
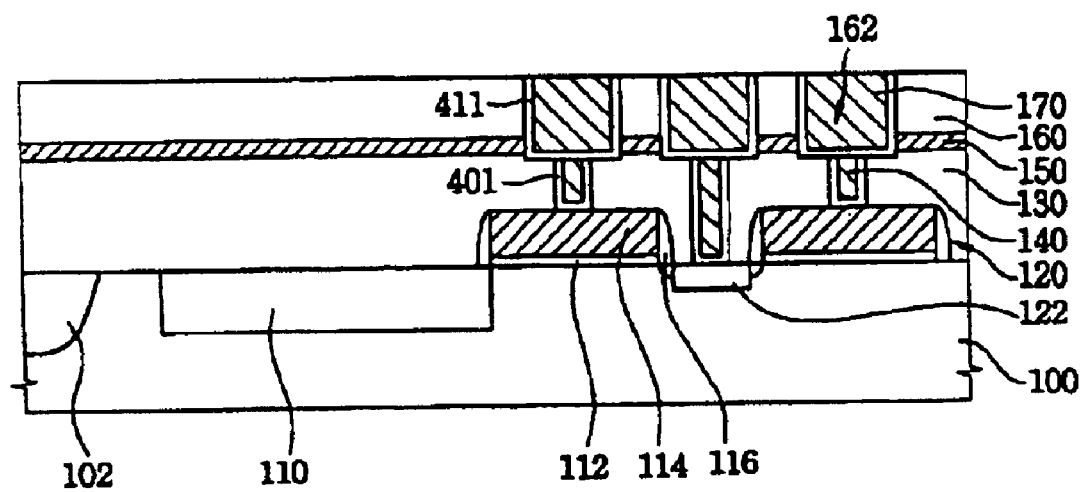

Also, lower interconnections 170 are formed in trenches 162 in the second interlayer dielectric layer 160 on portions of a barrier metal layer 411 in the same manner as that of the first embodiment, but no dummy hole is formed, as illustrated in FIG. 7B.

Figure 7C:
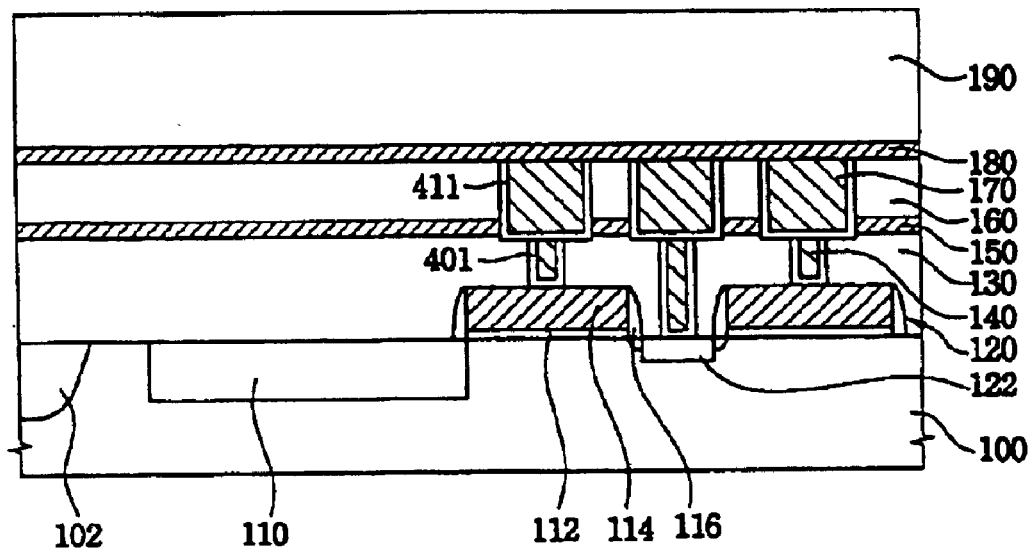

In FIG. 7C, a second diffusion barrier layer 180 and a third interlayer dielectric layer 190 are formed on the second interlayer dielectric layer 160 in the same manner as in the first embodiment.

Figure 7D:
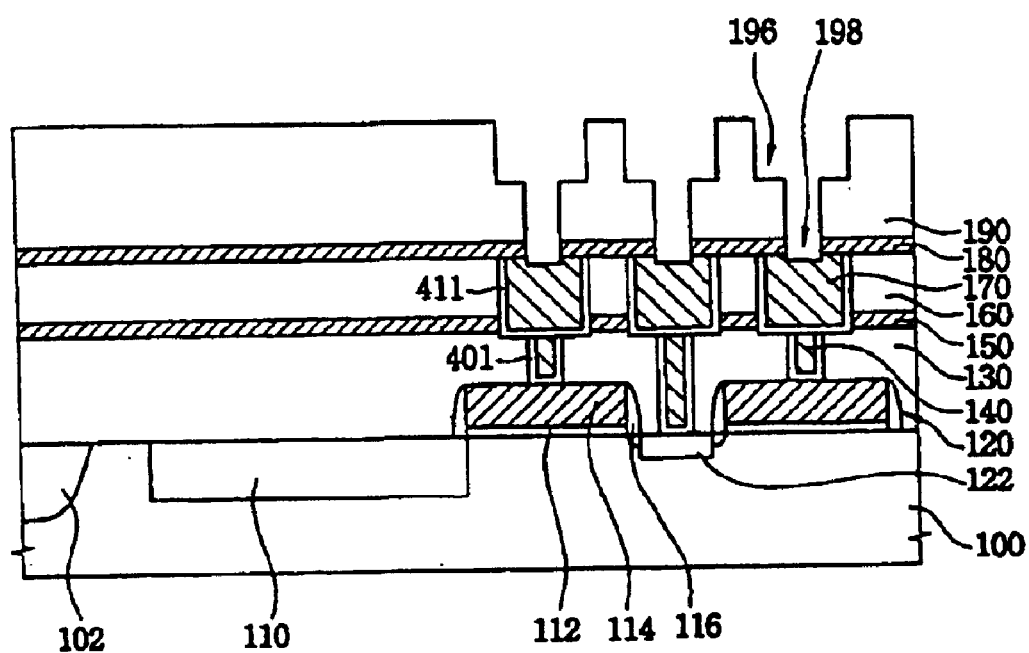
Figure 7E:
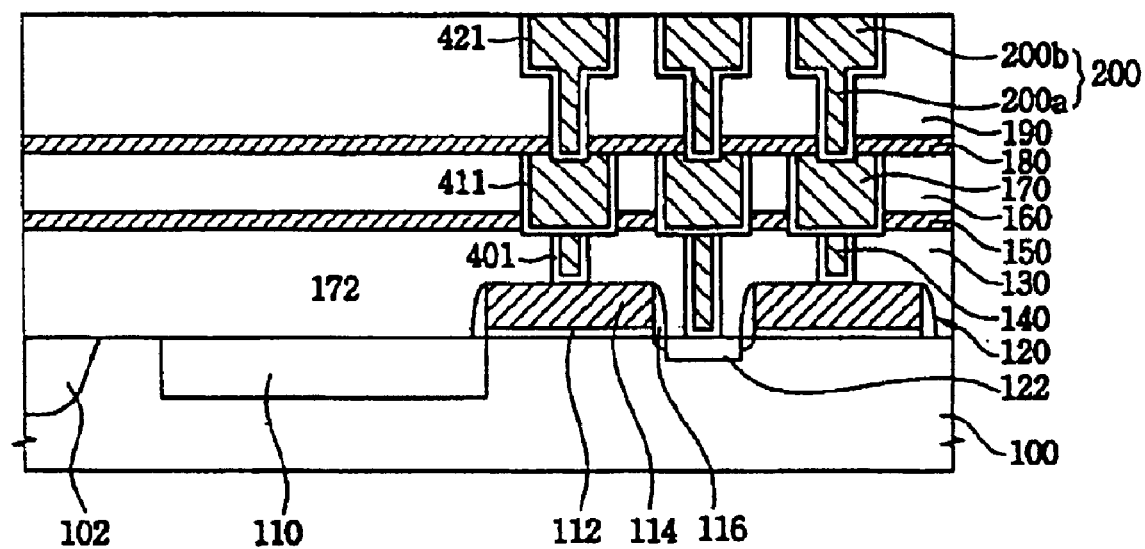

In the fourth embodiment, via holes 198 and trenches 196 are patterned without patterning dummy holes as illustrated in FIG. 7D. Then, in FIG. 7E, third metal barrier layer (not shown) is formed on the third interlayer dielectric layer 190 and in the trenches 196 and via holes 198, and a second copper layer (not shown) is formed on the third barrier metal layer. The second copper layer is planarized by, for example, CMP and portions of the third metal barrier layer are removed to expose an upper surface of the third interlayer dielectric layer 190, and to form first interconnections 200 formed of trenches 200b and vias 200a on portions of barrier metal layer 421, as illustrated in FIG. 7E.

Figure 7F:
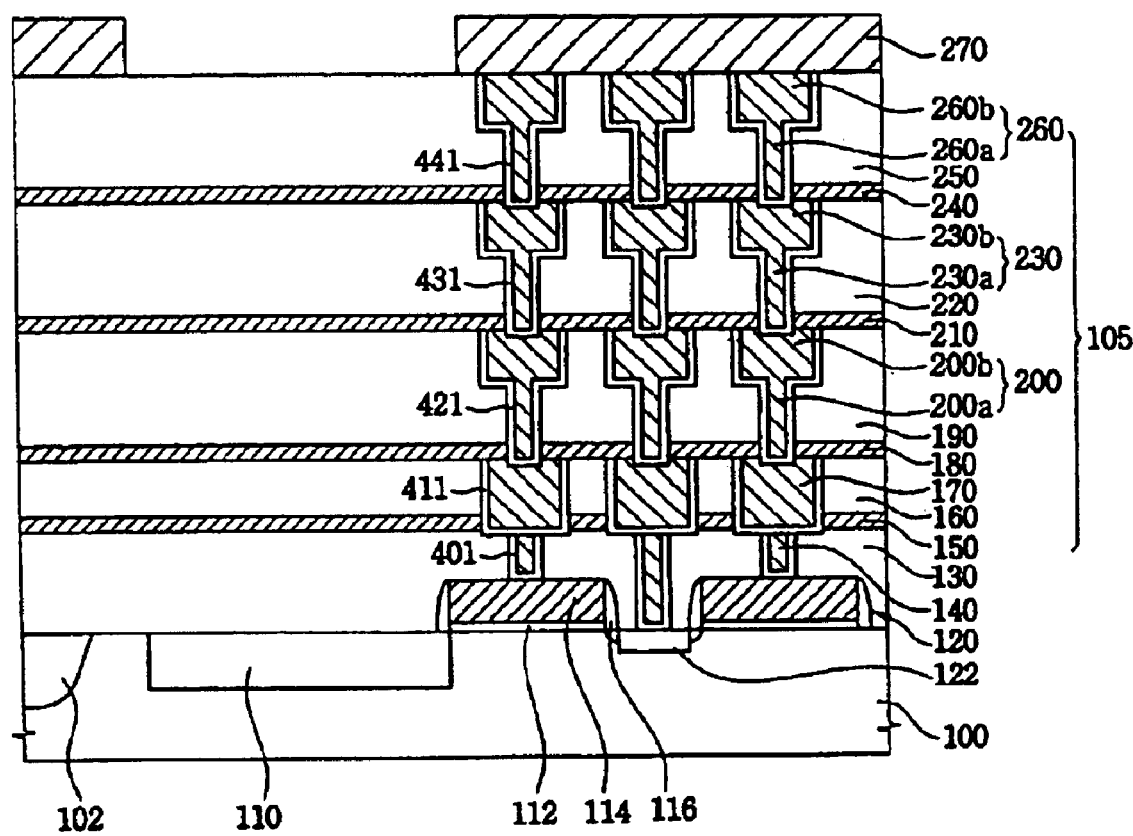

Referring to FIG. 7F, a third diffusion barrier layer 210, a fourth interlayer dielectric layer 220, a fourth diffusion barrier layer 240 and a fifth interlayer dielectric layer 250 are sequentially deposited on the third interlayer dielectric layer 190. The third diffusion barrier layer 210 and the fourth interlayer dielectric layer 220, as well as the fourth diffusion barrier layer 240 and a fifth interlayer dielectric layer 250 are etched in a same manner as the second diffusion barrier layer 180 and the third interlayer dielectric layer 190 to form trenches and via holes therein (neither are shown). Barrier metal layers and copper layers (neither shown) are formed on the interlayer dielectric layers and in the trenches and via holes, and are planarized in a same manner as the third metal barrier layer (not shown) and the second copper layer (not shown). Interconnections 230 and 260, which are respectively made up of trenches 230b and 260b, and vias 230a and 260a, are formed in portions of barrier metal layers 431 and 441, respectively, by the aforementioned process, which is a same process by which the first interconnections 200 were formed. Then, a first protection layer 270 is formed on the uppermost interlayer dielectric layer 250 as illustrated in FIG. 7F, to protect the electrical interconnection line 105 when a light passageway 272 is later formed over the p/n photodiode 110.

Figure 7G:
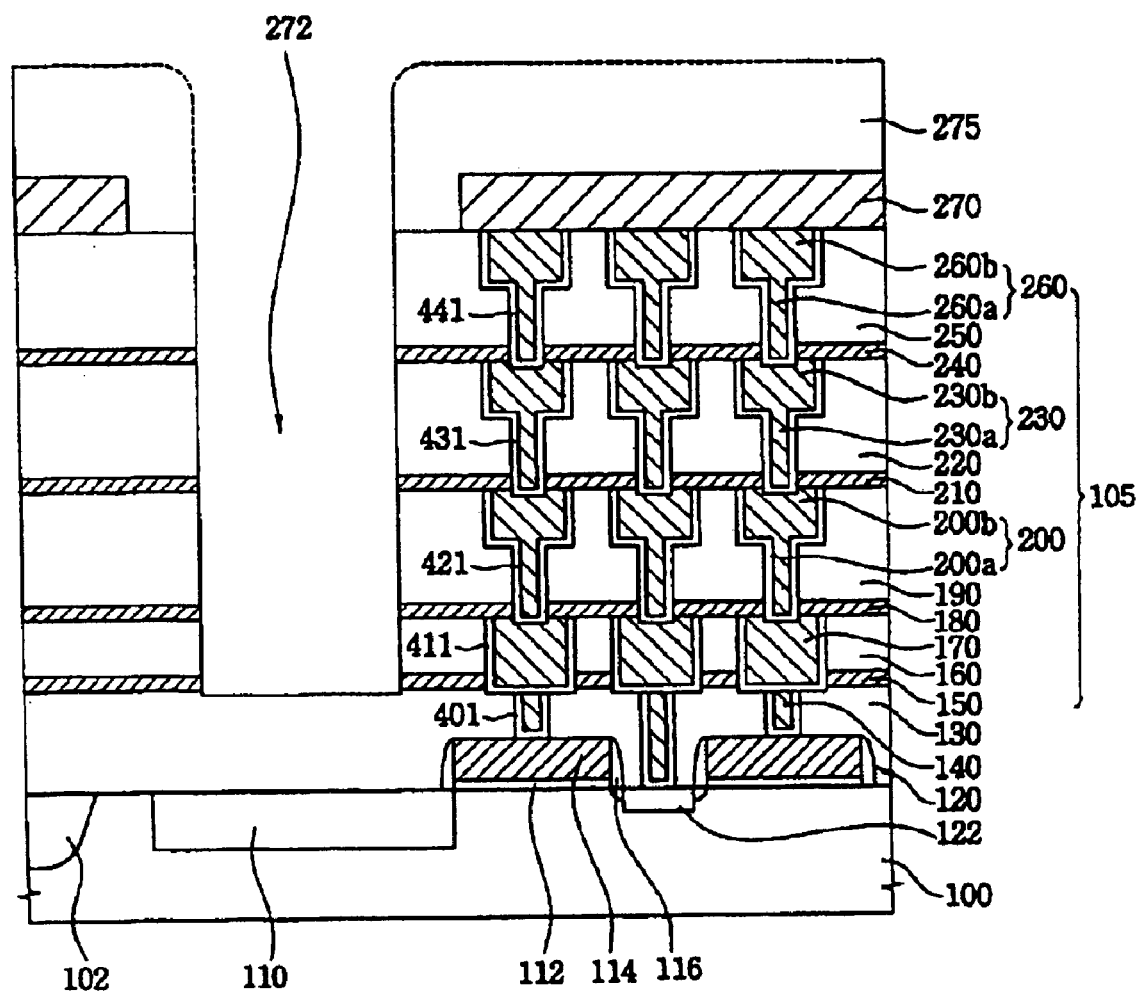

Referring to FIG. 7G, a photoresist (not shown) is formed on the resulting structure, and is exposed to form a photoresist mask pattern 275. Thereafter, the fifth interlayer dielectric layer 250, the fourth diffusion barrier layer 240, the fourth interlayer dielectric layer 220, the third diffusion barrier layer 210, the third interlayer dielectric layer 190, the second diffusion barrier layer 180, the second Interlayer dielectric layer 160, and the first diffusion barrier layer 150 are sequentially etched by, for example, a dry etching process to be removed from above the p/n photodiode 110, to thereby form a light passageway 272. The dry etching process may include a photo etch process in a gas including one or a combination of $C_xF_y$, $N_2$, Ar and $O_2$. An ordinary cleaning step, such as a wet etch process in a solution of 5% to 10% $H_2SO_4$, 5% $H_2O_2$, and 5% $H_2O$, may follow the dry etching process.

Figure 7H:
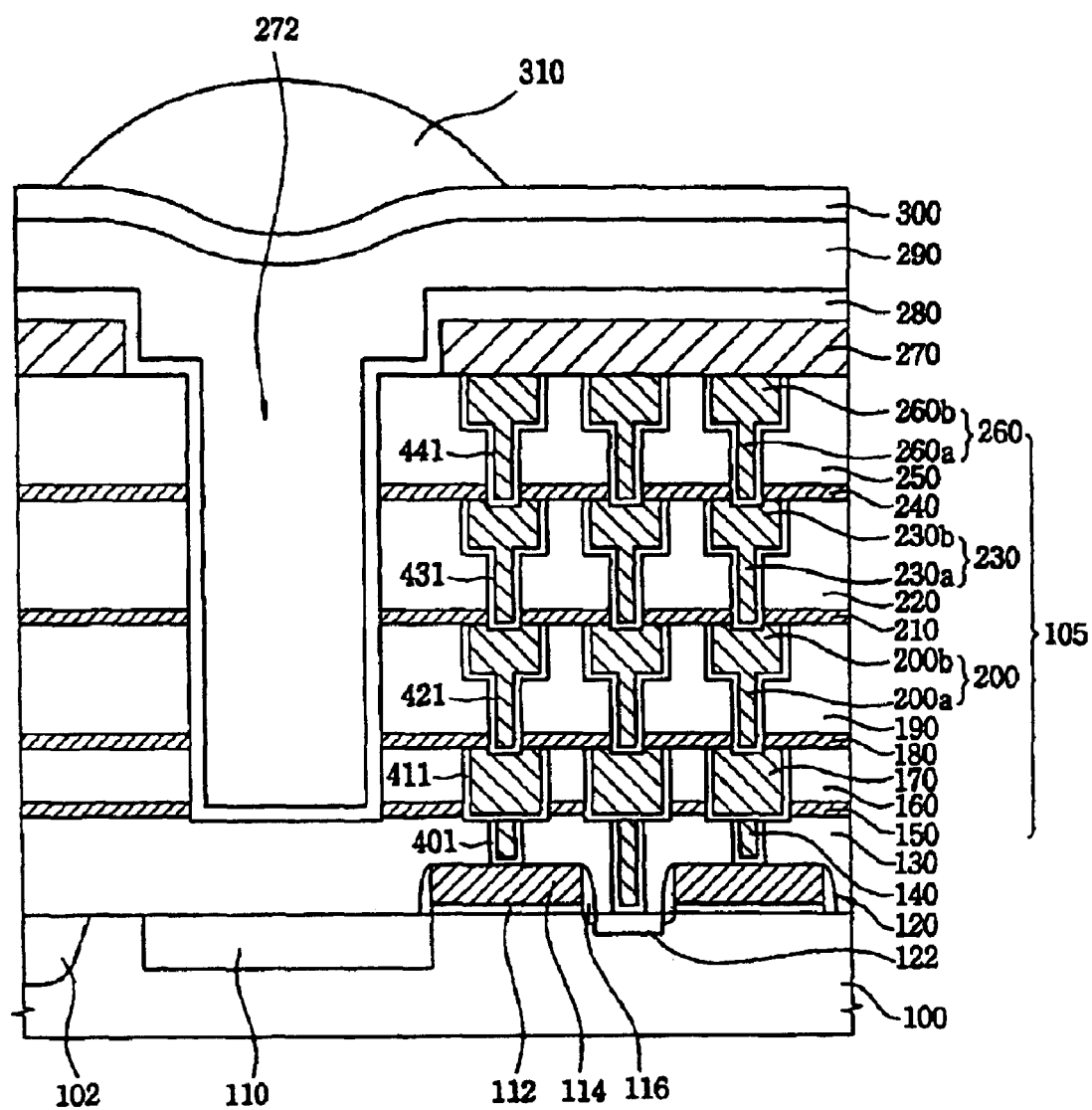

The photoresist mask pattern 275 is removed, and the remaining steps of depositing an optional second protection layer 280, filling the light passageway with a transparent material 290 such as a SOG or a photoresist, forming a color filter 300 on the transparent material 290 and forming a lens 310 on the color filter 300 over a light inlet of the light passageway 272 are the same as in the first, second and third embodiments. The resulting structure is as shown in FIG. 7H.

Finally, in all of the four embodiments described herein, an antireflection layer 500 may be formed on the substrate having the p/n photodiode 110, the isolation region 102 and the plurality of transistors 120, as illustrated in FIG. 8. Alternatively, an antireflection layer 501 may be patterned under the light passageway 272, as illustrated in FIG. 9.

As described herein, barrier metal layers for the prevention of copper diffusion into the interlayer dielectric layers are provided by the embodiments of the present invention. A barrier metal such as tantalum, tantalum nitride, and tantalum nitride on tantalum may be used for the barrier metal layers. After patterning a first interlayer dielectric layer to form contact holes, a first barrier metal layer may be formed in the contact holes using a standard sputtering method. However, if a lower contact is made of tungsten or titanium, the barrier metal layer may be omitted at the bottom of the contact holes.

Additional barrier metal layers are formed in via holes and trenches to be filled with copper, to prevent diffusion of copper atoms into surrounding interlayer dielectric layers and the underlying substrate, where they can cause adverse electrical effects at the transistors. By depositing additional barrier metal layers by an RF resputtering process with bias, as in an embodiment of the present invention, all or virtually all of the barrier metal is removed from the bottom of the via holes and adhered to the sidewalls thereof, thereby reducing the contact resistance of the vias. The present invention, as previously described, allows a photodiode of an image sensor device to be formed having copper interconnections, thereby providing the capability of forming a semiconductor device that employs a photodiode having a design rule or pattern thickness below 0.13 μm, while simultaneously protecting underlying transistors from copper diffusion.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An image sensor device, comprising:
  a substrate having a photodiode formed therein, and a plurality of transistors formed on the substrate, the photodiode being electrically associated with the transistors;
  at least one lower contact formed on source/drain regions and gates of the transistors;
  at least one electrical interconnection line formed on the at least one lower contact and being electrically associated with the photodiode;
  a light passageway having a light inlet, the light passageway being positioned in alignment with the photodiode;
  a color filter positioned over the light inlet of the light passageway; and
  a lens positioned over the color filter in alignment with the light passageway,
  wherein the at least one electrical interconnection line includes a copper interconnection formation running through a plurality of interlayer dielectric layers in a stacked configuration with a diffusion barrier layer between adjacent interlayer dielectric layers, and a barrier metal layer between the copper interconnection formation and the plurality of interlayer dielectric layers and intervening diffusion barrier layers.

2. An image sensor device as claimed in claim 1, further comprising a first protection layer covering an uppermost surface of the copper interconnection.

3. An image sensor device as claimed in claim 2, wherein the first protection layer is formed of at least one selected from the group consisting of SiC, SiN, SiO2 on SiN, and SiO2 on SiC.

4. An image sensor device as claimed in claim 2, further comprising a second protection layer disposed on the first protection layer and an inner surface of the light passageway.

5. An image sensor device as claimed in claim 4, wherein the second protection layer is formed of a silicon oxide series material.

6. An image sensor device as claimed in claim 4, wherein the second protection layer has an antireflective property at a bottom of the light passageway.

7. An image sensor device as claimed in claim 1, wherein the lower contact is formed of one selected from the group consisting of copper, tungsten and titanium.

8. An image sensor device as claimed in claim 7, wherein when the lower contact is formed of copper, a barrier metal layer is interposed between the lower contact and the first of the plurality of interlayer dielectric layers.

9. An image sensor device as claimed in claim 1, further comprising an antireflection layer formed on the substrate having the photodiode, the plurality of transistors and the isolation region.

10. An image sensor device as claimed in claim 1, further comprising an antireflection layer patterned on the photodiode under the light passageway.

11. An image sensor device as claimed in claim 1, wherein the light passageway is filled with a transparent material.

12. An image sensor device as claimed in claim 11, wherein the transparent material is a spin-on-glass or a photoresist.

13. An image sensor device as claimed in claim 1, wherein the lens is a convexly shaped micro lens.

14. An image sensor device as claimed in claim 1, further comprising a barrier metal layer on sidewalls of the light passageway.

* * * * *